US010395836B2

(12) United States Patent
Sawada et al.

(10) Patent No.: US 10,395,836 B2
(45) Date of Patent: Aug. 27, 2019

(54) MULTILAYER CERAMIC ELECTRONIC COMPONENT

(71) Applicant: Murata Manufacturing Co., Ltd., Nagaokakyo-shi, Kyoto-fu (JP)

(72) Inventors: Takashi Sawada, Nagaokakyo (JP); Yasuo Fujii, Nagaokakyo (JP); Takayuki Kayatani, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/611,884

(22) Filed: Jun. 2, 2017

(65) Prior Publication Data

US 2017/0352486 A1  Dec. 7, 2017

(30) Foreign Application Priority Data

Jun. 6, 2016  (JP) .................................. 2016-112717

(51) Int. Cl.
*H01G 4/30* (2006.01)
*H01G 4/005* (2006.01)
(Continued)

(52) U.S. Cl.
CPC .............. *H01G 4/30* (2013.01); *H01G 4/005* (2013.01); *H01G 4/012* (2013.01); *H01G 4/224* (2013.01);
(Continued)

(58) Field of Classification Search
CPC .......... H01G 4/30; H01G 4/005; H01G 4/008; H01G 4/12; H01G 4/012; H01G 4/224;
(Continued)

(56) References Cited

U.S. PATENT DOCUMENTS

2008/0156413 A1* 7/2008 Nomiya ................. H05K 1/092
156/89.12
2009/0064476 A1* 3/2009 Cross .................... H01L 41/083
29/25.35
(Continued)

FOREIGN PATENT DOCUMENTS

JP  2013-055320 A  3/2013
JP  2015-019079 A  1/2015
(Continued)

OTHER PUBLICATIONS

Sawada et al., "Multilayer Ceramic Electronic Component," U.S. Appl. No. 15/611,874, filed Jun. 2, 2017.
(Continued)

*Primary Examiner* — Timothy J Thompson
*Assistant Examiner* — Guillermo J Egoavil
(74) *Attorney, Agent, or Firm* — Keating & Bennett, LLP

(57) ABSTRACT

A multilayer ceramic electronic component includes a laminated body, a first external electrode, a pair of second external electrodes, and a pair of insulating coating portions. The pair of insulating coating portions extends in a laminating direction between each of the pair of second external electrodes and the first external electrode on a second principal surface, from the second principal surface to respective portions of a first side surface and a second side surface. As viewed from at least one direction in the laminating direction, an end of the pair of insulating coating portions, which is located closest to a first principal surface, is located closer to the first principal surface than an end of the first external electrode and pair of second external electrodes, which is located closest to the first principal surface.

19 Claims, 15 Drawing Sheets

(51) Int. Cl.
  *H01G 4/12*    (2006.01)
  *H01G 4/248*   (2006.01)
  *H01K 1/18*    (2006.01)
  *H05K 1/18*    (2006.01)
  *H01G 4/012*   (2006.01)
  *H01G 4/224*   (2006.01)
  *H01G 4/232*   (2006.01)

(52) U.S. Cl.
  CPC ............. *H01G 4/232* (2013.01); *H01G 4/248* (2013.01); *H05K 1/181* (2013.01); *H01G 4/1227* (2013.01); *H01G 4/1236* (2013.01); *H05K 2201/10015* (2013.01)

(58) Field of Classification Search
  CPC .... H01G 4/232; H01G 4/2325; H01G 4/1227; H01G 4/248; H05K 1/18; H05K 1/181; H05K 1/0231; H05K 1/111; H05K 3/3431; H05K 2201/10015
  USPC .................... 174/60, 260; 361/303, 301.4
  See application file for complete search history.

(56) References Cited

U.S. PATENT DOCUMENTS

| | | | |
|---|---|---|---|
| 2012/0007709 A1* | 1/2012 | Taniguchi | H01G 4/005 336/200 |
| 2013/0050893 A1* | 2/2013 | Kim | H01G 4/228 361/306.3 |
| 2013/0050897 A1 | 2/2013 | Kim | |
| 2013/0058006 A1 | 3/2013 | Kim | |
| 2014/0160615 A1 | 6/2014 | Lee et al. | |
| 2014/0168851 A1* | 6/2014 | Lee | H01G 4/30 361/303 |
| 2015/0022945 A1* | 1/2015 | Park | H01G 4/30 361/301.4 |
| 2016/0049242 A1 | 2/2016 | Sawada et al. | |
| 2017/0062133 A1* | 3/2017 | Lee | H01G 4/30 |
| 2017/0352485 A1* | 12/2017 | Kayatani | H01G 4/232 |
| 2017/0352487 A1* | 12/2017 | Kayatani | H01G 4/008 |

FOREIGN PATENT DOCUMENTS

| KR | 10-2013-0025595 A | 3/2013 |
|---|---|---|
| KR | 10-1452058 B1 | 10/2014 |

OTHER PUBLICATIONS

Kayatani et al., "Multilayer Ceramic Electronic Component," U.S. Appl. No. 15/611,880, filed Jun. 2, 2017.

Kayatani et al., "Multilayer Ceramic Electronic Component," U.S. Appl. No. 15/611,887, filed Jun. 2, 2017.

Fujii et al., "Electronic Component," U.S. Appl. No. 15/611,888, filed Jun. 2, 2017.

\* cited by examiner

MULTILAYER CERAMIC ELECTRONIC COMPONENT

CROSS REFERENCE TO RELATED APPLICATIONS

This application claims the benefit of priority to Japanese Patent Application No. 2016-112717 filed on Jun. 6, 2016. The entire contents of this application are hereby incorporated herein by reference.

BACKGROUND OF THE INVENTION

1. Field of the Invention

The present invention relates to a multilayer ceramic electronic component.

2. Description of the Related Art

Japanese Patent Application Laid-Open No. 2013-55320 discloses a three-terminal vertically laminated multilayer ceramic capacitor. The multilayer ceramic capacitor disclosed in Japanese Patent Application Laid-Open No. 2013-55320 includes a ceramic body, internal electrodes formed within the ceramic body, an insulating layer formed on one surface of the ceramic body, and external electrodes. The internal electrodes include a first internal electrode and a second internal electrode. The external electrodes include a first external electrode, a second external electrode, and a third external electrode.

The ceramic body has a first surface and a second surface that are opposite to each other, a third surface, a fourth surface, a fifth surface, and a sixth surface that connect the first surface and the second surface. The third surface and the fourth surface are opposite to each other, whereas the fifth surface and the sixth surface are opposite to each other.

The first external electrode and the third external electrode are each extended from the first surface of the ceramic body, and formed over the third surface or the fourth surface connected to the first surface. On the first surface of the ceramic body, the second external electrode is located between the first external electrode and the third external electrode. The first external electrode and the third external electrode are each connected to the first internal electrode. The second external electrode is connected to the second internal electrode.

The insulating layer is formed on each of the first surface, third surface, and fourth surface of the ceramic body. The insulating layer includes a first insulating layer and a second insulating layer. The first insulating layer is located between the first external electrode and the second external electrode on the first surface of the ceramic body. The second insulating layer is located between the second external electrode and the third external electrode on the first surface of the ceramic body.

In multilayer ceramic electronic components such as three-terminal vertically laminated multilayer ceramic capacitors, migration may be caused between external electrodes that differ in polarity, alongside surfaces of laminated bodies as fifth and sixth surfaces of ceramic bodies.

SUMMARY OF THE INVENTION

Preferred embodiments of the present invention provide multilayer ceramic electronic components which are able to significantly reduce or prevent migration alongside surfaces of a laminated body.

A multilayer ceramic electronic component in accordance with a preferred embodiment of the present invention includes a laminated body, a first external electrode, a pair of second external electrodes, and a pair of insulating coating portions. The laminated body includes multiple dielectric layers and multiple internal electrode layers that are laminated. The laminated body includes a first side surface and a second side surface opposite to each other in a laminating direction, a first principal surface and a second principal surface opposite to each other in a height direction perpendicular or substantially perpendicular to the laminating direction, and a first end surface and a second end surface opposite to each other in a length direction perpendicular or substantially perpendicular to both the laminating direction and the height direction. The first external electrode extends in the laminating direction on a central portion of the second principal surface in the length direction, from the second principal surface to respective portions of the first side surface and second side surface. The pair of second external electrodes includes one second external electrode extending in the laminating direction on one end of the second principal surface in the length direction, and the other second external electrode extending in the laminating direction on the other end of the second principal surface in the length direction. The pair of insulating coating portions includes one insulating coating portion extending in the laminating direction between one second external electrode and the first external electrode on the second principal surface, and the other insulating coating portion extending in the laminating direction between the other second external electrode and the first external electrode on the second principal surface. The multiple internal electrode layers include: multiple first internal electrode layers connected to the first external electrode; and multiple second internal electrode layers connected to each of the pair of second external electrodes. One second external electrode extends from the second principal surface to a portion of at least one of the first side surface and the second side surface, and to a portion of the first end surface. The other second external electrodes extends from the second principal surface to a portion of at least one of the first side surface and the second side surface, and to a portion of the second end surface. The pair of insulating coating portions each extends from the second principal surface to a portion of the at least one of the respective first side surface and second side surface. As viewed from at least one direction in the laminating direction, an end of the pair of insulating coating portions, which is located closest to the first principal surface, is located closer to the first principal surface than an end of the first external electrode and pair of second external electrodes, which is located closest to the first principal surface.

According to a preferred embodiment of the present invention, as viewed from at least one direction in the laminating direction, the distance in the height direction is about 20 μm or more, for example, between an end of the pair of insulating coating portions, which is located closest to the first principal surface, and an end of the first external electrode and pair of second external electrodes, which is located closest to the first principal surface.

According to a preferred embodiment of the present invention, the maximum thickness of the first external electrode on the second principal surface is larger than the maximum thickness of the pair of second external electrodes on the second principal surface. The maximum thickness of the pair of insulating coating portions on the second principal surface is larger than the maximum thickness of the first external electrode on the second principal surface.

According to a preferred embodiment of the present invention, the maximum thickness of the first external electrode on the second principal surface is larger than the maximum thickness of the pair of second external electrodes on the second principal surface. The maximum thickness of the pair of second external electrodes on the second principal surface is larger than the maximum thickness of the pair of insulating coating portions on the second principal surface.

According to a preferred embodiment of the present invention, the pair of insulating coating portions includes overlapping portions that overlap with respective portions of the first external electrode and pair of second external electrodes in the height direction. The overlapping portions of the pair of insulating coating portions cover the respective portions of the first external electrode and pair of second external electrodes.

According to a preferred embodiment of the present invention, the pair of insulating coating portions includes overlapping portions that overlap with respective portions of the first external electrode and pair of second external electrodes in the height direction. The overlapping portions of the pair of insulating coating portions are covered with the respective portions of the first external electrode and pair of second external electrodes.

According to a preferred embodiment of the present invention, the pair of insulating coating portions includes a material including a dielectric ceramic, a resin, or glass.

According to a preferred embodiment of the present invention, the pair of insulating coating portions includes a material including a dielectric ceramic. The dielectric ceramic includes $BaTiO_3$, $CaTiO_3$, $SrTiO_3$, or $CaZrO_3$.

According to a preferred embodiment of the present invention, the pair of insulating coating portions includes a material including a resin. The resin includes an epoxy-based resin or a polyimide-based resin.

According to a preferred embodiment of the present invention, the pair of insulating coating portions includes a material including glass. The glass includes Ba or Sr.

According to preferred embodiments of the present invention, migration is able to be significantly reduced or prevented along the side surfaces of the laminated body.

The above and other elements, features, steps, characteristics and advantages of the present invention will become more apparent from the following detailed description of the preferred embodiments with reference to the attached drawings.

DETAILED DESCRIPTION OF THE INVENTION

Multilayer ceramic electronic components according to respective preferred embodiments of the present invention will be described below with reference to the drawings. In the following descriptions of the preferred embodiments, identical or corresponding portions in the figures are denoted by identical symbols, but the descriptions of the portions will not be repeated. While multilayer ceramic capacitors will be described as the multilayer ceramic electronic component in the respective preferred embodiments of the present invention, the multilayer ceramic electronic component is not limited to any multilayer ceramic capacitor, but may be a multilayer ceramic inductor, a multilayer ceramic thermistor, or the like, for example.

First Preferred Embodiment

Figure 1:
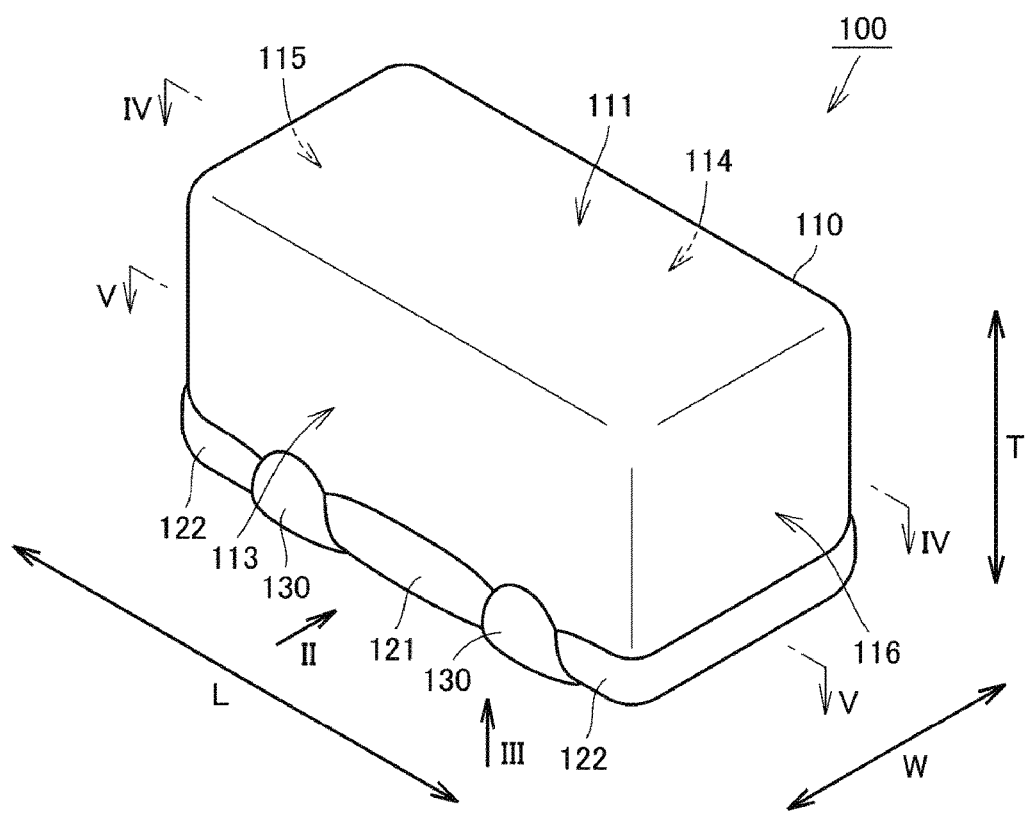
FIG. 1 is a perspective view showing an appearance of a multilayer ceramic electronic component according to a first preferred embodiment of the present invention.
Figure 2:
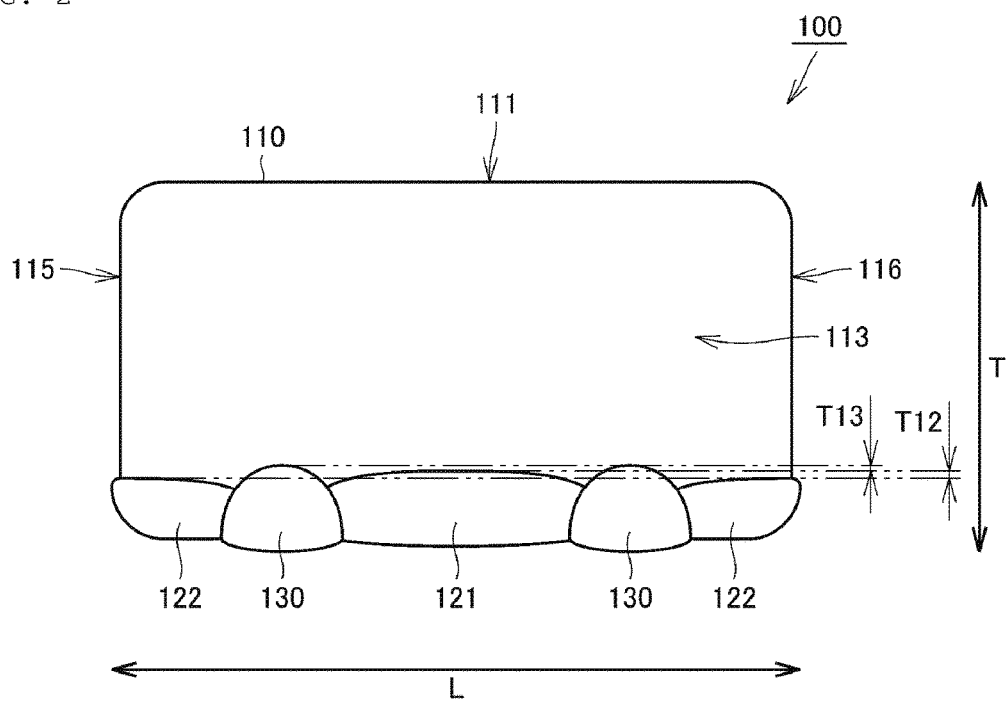
FIG. 2 is a side view of the multilayer ceramic electronic component in FIG. 1 as viewed from the direction of an arrow II.
Figure 3:
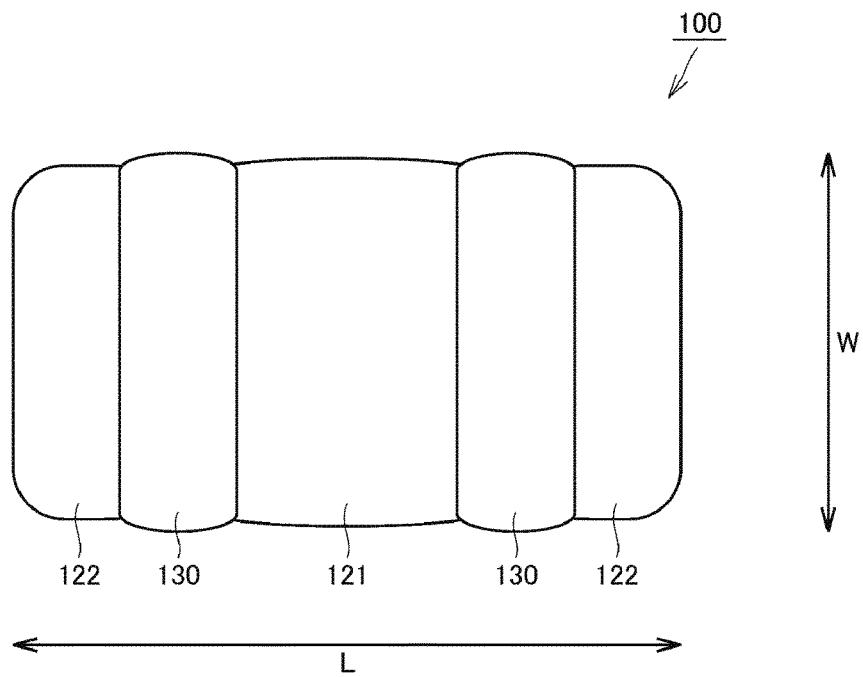
FIG. 3 is a bottom view of the multilayer ceramic electronic component in FIG. 1 as viewed from the direction of an arrow III.
Figure 4:
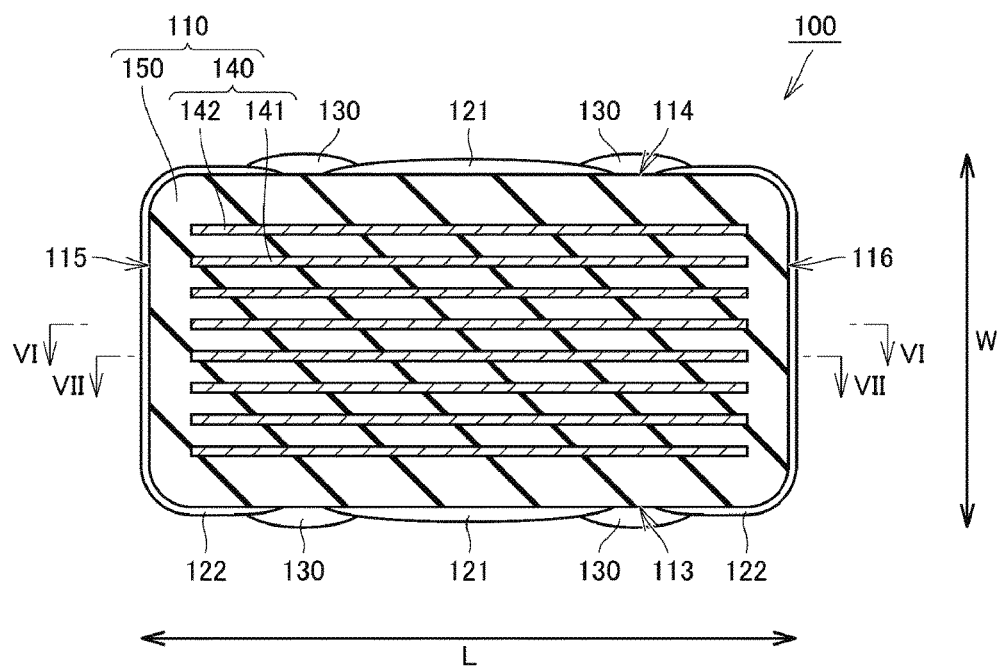
FIG. 4 is a cross-sectional view of the multilayer ceramic electronic component in FIG. 1 as viewed from the direction of arrows IV-IV.
Figure 5:
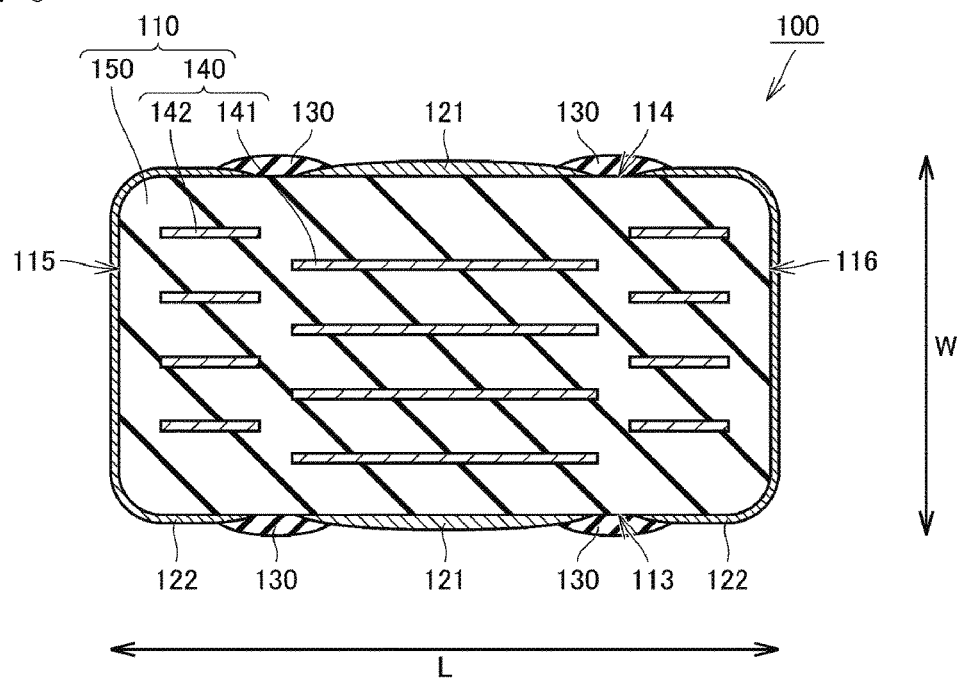
FIG. 5 is a cross-sectional view of the multilayer ceramic electronic component in FIG. 1 as viewed from the direction of arrows V-V.
Figure 6:
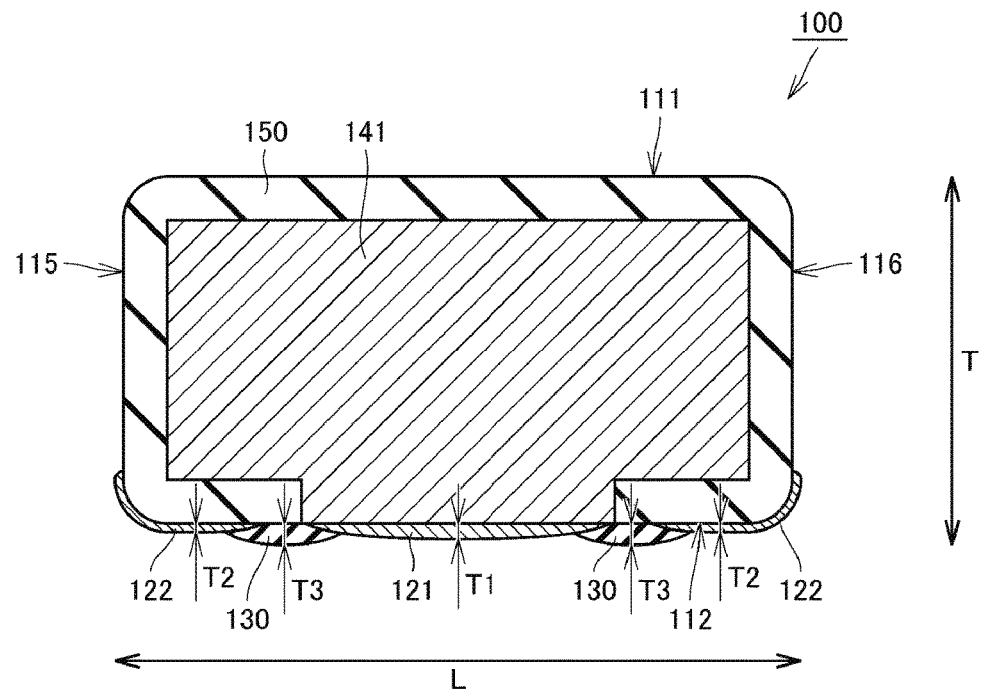
FIG. 6 is a cross-sectional view of the multilayer ceramic electronic component in FIG. 4 as viewed from the direction of arrows VI-VI.
Figure 7:
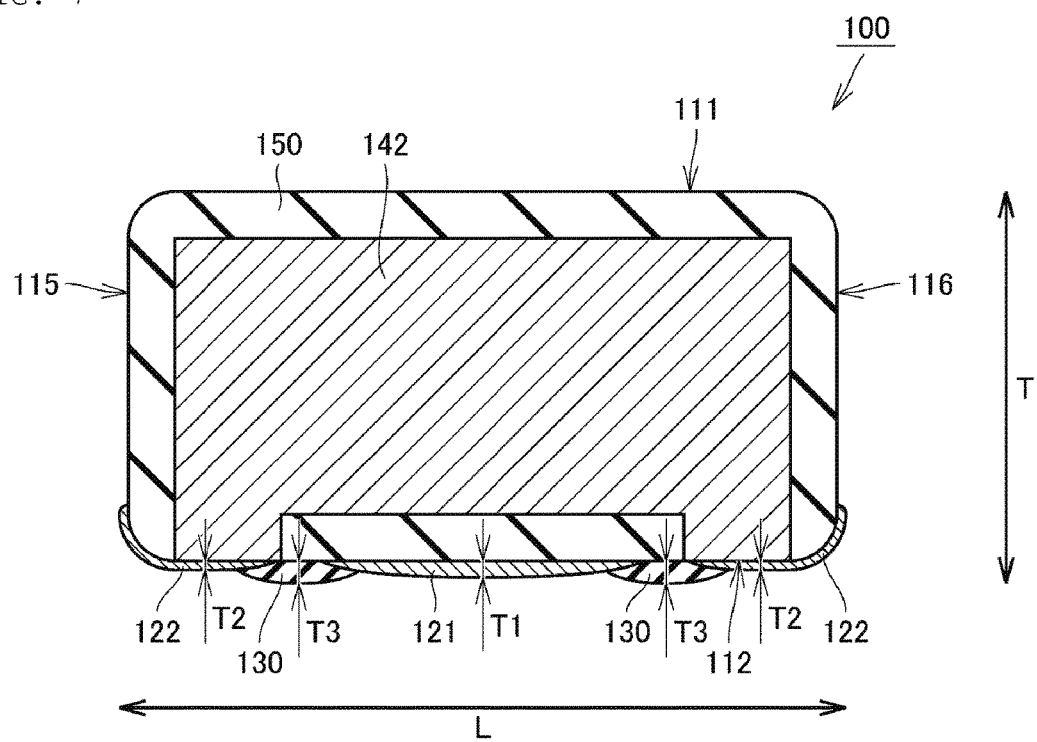
FIG. 7 is a cross-sectional view of the multilayer ceramic electronic component in FIG. 4 as viewed from the direction of arrows VII-VII.

FIG. 1 is a perspective view showing an appearance of a multilayer ceramic electronic component according to a first preferred embodiment of the present invention. FIG. 2 is a side view of the multilayer ceramic electronic component in FIG. 1 as viewed from the direction of an arrow II. FIG. 3 is a bottom view of the multilayer ceramic electronic component in FIG. 1 as viewed from the direction of an arrow III. FIG. 4 is a cross-sectional view of the multilayer ceramic electronic component in FIG. 1 as viewed from the direction of arrows IV-IV. FIG. 5 is a cross-sectional view of the multilayer ceramic electronic component in FIG. 1 as viewed from the direction of arrows V-V. FIG. 6 is a cross-sectional view of the multilayer ceramic electronic component in FIG. 4 as viewed from the direction of arrows VI-VI. FIG. 7 is a cross-sectional view of the multilayer ceramic electronic component in FIG. 4 as viewed from the direction of arrows VII-VII. In FIGS. 1 to 7, as will be described below, the length direction of a laminated body, the height direction of the laminated body, and the laminating direction of the laminated body are respectively denoted by L, T, and W.

As shown in FIGS. 1 to 7, a multilayer ceramic electronic component 100 according to the first preferred embodiment of the present invention includes a laminated body 110, a first external electrode 121, a pair of second external electrodes 122, and a pair of insulating coating portions 130.

The laminated body 110 preferably has a cuboid or substantially cuboid outer shape, for example. The laminated body 110 includes multiple dielectric layers 150 and multiple internal electrode layers 140. The laminated body 110 includes a first side surface 113 and a second side surface 114 opposite to each other in the laminating direction W, a first principal surface 111 and a second principal surface 112 opposite to each other in the height direction T perpendicular or substantially perpendicular to the laminating direction W, and a first end surface 115 and a second end surface 116 opposite to each other in the length direction L perpendicular or substantially perpendicular to both the laminating direction W and the height direction T.

The laminated body 110 has the cuboid or substantially cuboid outer shape as mentioned above, but preferably has corners and ridges that are rounded, for example. The corner refers to the intersection of three surfaces of the laminated body 110, and the ridge refers to the intersection of two surfaces of the laminated body 110. At least one of the first principal surface 111, second principal surface 112, first side surface 113, second side surface 114, first end surface 115, and second end surface 116 may include an asperity or asperities, for example.

As for the outside dimensions of the multilayer ceramic electronic component 100, for example, the dimension in the length direction L is about 2.0 mm or more and about 2.3 mm or less, the dimension in the laminating direction W is about 1.2 mm or more and about 1.55 mm or less, and the dimension in the height direction T is about 0.5 mm or more and about 1.0 mm or less, for example. The outside dimensions of the multilayer ceramic electronic component 100 are able to be measured with a micrometer.

The laminated body 110 is segmented into a pair of outer layer portions and an inner layer portion in the laminating direction W. One of the pair of outer layer portions is a portion including the first side surface 113 of the laminated body 110, and includes a dielectric layer 150 located between the first side surface 113 and a first internal electrode layer 141 closest to the first side surface 113 as will be described below. The other of the pair of outer layer portions is a portion including the second side surface 114 of the laminated body 110, and includes a dielectric layer 150 located between the second side surface 114 and a second internal electrode layer 142 closest to the second side surface 114 as will be described below.

The inner layer portion is a region sandwiched between the pair of outer layer portions. More specifically, the inner layer portion includes multiple dielectric layers 150 that do not define the outer layer portions, and all of the internal electrode layers 140.

The number of multiple dielectric layers 150 laminated is preferably 20 or more and 1100 or less, for example. The pair of outer layer portions is each preferably about 10 μm or more and about 80 μm or less in thickness, for example. The multiple dielectric layers 150 included in the inner layer portion are each preferably about 0.4 μm or more and about 3 μm or less in thickness, for example.

The dielectric layers 150 include a perovskite-type compound containing Ba or Ti.

Dielectric ceramics containing, as a main component, $BaTiO_3$, $CaTiO_3$, $SrTiO_3$, $CaZrO_3$, or the like are able to be included as a material defining the dielectric layers 150. In addition, materials may be included where the foregoing main components have an Mn compound, an Mg compound, an Si compound, an Fe compound, a Cr compound, a Co compound, an Ni compound, an Al compound, a V compound, a rare-earth compound, or the like added thereto as an accessory material, for example.

The multiple internal electrode layers 140 include multiple first internal electrode layers 141 connected to the first external electrode 121 and multiple second internal electrode layers 142 connected to the second external electrode 122.

The number of multiple internal electrode layers 140 laminated is preferably 10 or more and 1100 or less, for example. The multiple internal electrode layers 140 are each preferably about 0.3 μm or more and about 1.0 μm or less in thickness, for example. The coverage for each of the multiple internal electrode layers 140 covering the dielectric layers 150 without any space is preferably about 50% or more and about 95% or less, for example.

The material defining the internal electrode layers 140 is a metal selected from the group consisting of Ni, Cu, Ag, Pd, and Au, or an alloy containing the metal, and, for example, an alloy of Ag and Pd is able to be included. The internal electrode layers 140 may include dielectric grains of a same or similar composition as the dielectric ceramic included in the dielectric layers 150, for example.

The first internal electrode layers 141 and the second internal electrode layers 142 are each rectangular or substantially rectangular as viewed from the laminating direction W of the laminated body 110. The first internal electrode layers 141 and the second internal electrode layers 142 are alternately disposed at regular intervals in the laminating direction W of the laminated body 110. In addition, the first internal electrode layers 141 and the second internal electrode layers 142 are disposed to be opposite to each other with the dielectric layers 150 interposed therebetween.

The first internal electrode layers 141 each include an opposed electrode portion located opposite to the second internal electrode layer 142, and an extended electrode portion extended from the opposed electrode portion to the second principal surface 112 of the laminated body 110. The extended electrode portion of the first internal electrode layer 141 is extended to a central portion of the second principal surface 112 in the length direction L of the laminated body 110.

The second internal electrode layers 142 each include an opposed electrode portion located opposite to the first internal electrode layer 141, and an extended electrode portion extended from the opposed electrode portion to the second principal surface 112 of the laminated body 110. The extended electrode portion of the second internal electrode layer 142 is extended to both ends of the second principal surface 112 in the length direction L of the laminated body 110.

The dielectric layer 150 is located between the opposed electrode portion of the first internal electrode layer 141 and the opposed electrode portion of the second internal electrode layer 142, thus generating an electrostatic capacitance. Thus, the function of a capacitor is provided.

In the laminated body 110, as viewed from the laminating direction W of the laminated body 110, the location between the opposed electrode portion and the first principal surface 111 is referred to as a first side margin, the location between the opposed electrode portion and the second principal surface 112 is referred to as a second side margin, the location between the opposed electrode portion and the first end surface 115 is referred to as a first end margin, and the location between the opposed electrode portion and the second end surface 116 is referred to as a second end margin.

The first side margin and the second side margin are each preferably about 5 µm or more and about 80 µm or less in thickness in the height direction T of the laminated body 110, for example. The first end margin and the second end margin are each preferably about 5 µm or more and about 80 µm or less in thickness in the length direction L of the laminated body 110, for example.

The second side margin includes the respective extended electrode portions of the multiple first internal electrode layers 141, the respective extended electrode portions of the multiple second internal electrode layers 142, and the multiple dielectric layers 150 adjacent to or in a vicinity of each of the extended electrode portions.

The first external electrode 121 extends in the laminating direction W in a central portion of the second principal surface 112 in the length direction L, from the second principal surface 112 to respective portions of the first side surface 113 and second side surface 114. The pair of second external electrodes 122 includes one second external electrode 122 that extends in the laminating direction W at one end of the second principal surface 112 in the length direction L, and the other second external electrode 122 that extends in the laminating direction W at the other end of the second principal surface 112 in the length direction L. One second external electrodes 122 extends from the second principal surface 112 to a portion of at least one of the first side surface 113 and the second side surface 114, and to a portion of the first end surface 115. The other second external electrode 122 extends from the second principal surface 112 to a portion of at least one of the first side surface 113 and the second side surface 114, and to a portion of the second end surface 116.

According to the present preferred embodiment, one second external electrode 122 extends in the laminating direction W at one end of the second principal surface 112 in the length direction L, from the second principal surface 112 to respective portions of the first side surface 113, second side surface 114, and first end surface 115. The other second external electrode 122 extends in the laminating direction W at the other end of the second principal surface 112 in the length direction L, from the second principal surface 112 to respective portions of the first side surface 113, second side surface 114, and second end surface 116.

According to the present preferred embodiment, as shown in FIG. 6, the extended electrode portion of the first internal electrode layer 141 extended to the second principal surface 112 is partially not covered with the first external electrode 121. As shown in FIG. 7, the extended electrode portion of the second internal electrode layer 142 extended to the second principal surface 112 is partially not covered with the pair of second external electrodes 122.

The first external electrode 121 and the second external electrodes 122 each include a base electrode layer, and a plated layer disposed on the base electrode layer. The base electrode layer includes at least one of a baked layer and a thin film layer. The base electrode layer is preferably about 10 µm or more and about 100 µm or less in thickness, for example.

The baked layer includes glass and a metal. The material defining the baked layer is a metal selected from the group consisting of Ni, Cu, Ag, Pd, and Au, or an alloy containing the metal, and, for example, an alloy of Ag and Pd is able to be included. The baked layer may include multiple laminated layers, for example. The baked layer may be a layer obtained by applying a conductive paste to the laminated body 110 and baking the paste, or a layer subjected to co-firing with the internal electrode layers 140, for example.

The thin film layer is formed by a thin-film formation method such as a sputtering method or a vapor deposition method. The thin film layer is a layer of about 1 µm or less that includes metal particles, for example.

The material defining the plated layer is a metal selected from the group consisting of Ni, Cu, Ag, Pd, and Au, or an alloy containing the metal, and, for example, an alloy of Ag and Pd is able to be included.

The plated layer may include multiple laminated layers, for example. In this case, the plated layer preferably has a two-layer structure with an Sn plated layer formed on an Ni plated layer, for example. The Ni plated layer significantly reduces or prevents the base electrode layer from being eroded by solder used to mount the ceramic electronic component. The Sn plated layer improves the wettability to the solder used to mount the ceramic electronic component, and the ceramic electronic component is thus able to be easily mounted. The plated layers are preferably about 1.0 µm or more and about 10.0 µm or less in thickness per layer, for example.

The pair of insulating coating portions 130 includes one insulating coating portion 130 that extends in the laminating direction W between one second external electrode 122 and the first external electrode 121 on the second principal surface 112, and the other insulating coating portion 130 that extends in the laminating direction W between the other second external electrode 122 and the first external electrode 121 on the second principal surface 112. The pair of insulating coating portions 130 each extends from the second principal surface 112 to a portion of at least one of the first side surface 113 and the second side surface 114.

According to the present preferred embodiment, the pair of insulating coating portions 130 each extends from the second principal surface 112 to respective portions of the first side surface 113 and the second side surface 114. When the pair of insulating coating portions 130 each extends from the second principal surface 112 to a portion of one of the first side surface 113 and the second side surface 114, the pair of insulating coating portions 130 each extends on the first side surface 113 or second side surface 114 with the pair of second external electrodes each provided thereon.

The insulating coating portion 130 is preferably about 10 μm or more and about 150 μm or less in thickness, for example. A dielectric ceramic, a resin, or glass is able to be included as a material defining the insulating coating portions 130. When a dielectric ceramic is included as a material defining the insulating coating portions 130, $BaTiO_3$, $CaTiO_3$, $SrTiO_3$, $CaZrO_3$, or the like is able to be included as a main component. In addition, the foregoing main components may include an Mn compound, an Mg compound, an Si compound, an Fe compound, a Cr compound, a Co compound, an Ni compound, an Al compound, a V compound, a rare-earth compound, or the like added thereto as an accessory component, for example. The insulating coating portions 130 may be provided by applying ceramic dielectric slurry to the laminated body 110 and firing the slurry, or provided by co-firing simultaneously with a laminated chip as will be described below, for example.

When a resin is included as a material defining the insulating coating portions 130, a resin is included which includes an epoxy-based resin or a polyimide-based resin. In this case, the insulating coating portions 130 are provided by applying a resin paste to the laminated body 110, and thermally hardening the paste.

When glass is included as a material defining the insulating coating portions 130, glass containing Ba or Sr is included. In this case, the insulating coating portions 130 are provided by applying a glass paste to the laminated body 110, and baking the paste.

As shown in FIG. 2, as viewed from at least one direction in the laminating direction W, an end of the pair of insulating coating portions 130, which is located closest to the first principal surface 111, is located closer to the first principal surface 111 than an end of the first external electrode 121 and pair of second external electrodes 122, which is located closest to the first principal surface 111. It is to be noted that an end of at least one of one insulating coating portion 130 and the other insulating coating portion 130, which is located closest to the first principal surface 111, is located closer to the first principal surface 111 than an end of the first external electrode 121 and pair of second external electrodes 122, which is located closest to the first principal surface 111.

According to the present preferred embodiment, as viewed from at least one direction in the laminating direction W, the distance T13 in the height direction T is about 20 μm or more, for example, between an end of the pair of insulating coating portions 130, which is located closest to the first principal surface 111, and an end of the first external electrode 121 and pair of second external electrodes 122, which is located closest to the first principal surface 111. It is to be noted that the distance T13 in the height direction T is about 20 μm or more, for example, between the end of at least one of one insulating coating portion 130 and the other insulating coating portion 130, which is located closest to the first principal surface 111, and an end of the first external electrode 121 and pair of second external electrodes 122, which is located closest to the first principal surface 111.

According to the present preferred embodiment, as viewed from the laminating direction W, an end of the first external electrode 121, which is located closest to the first principal surface 111, is located closer to the first principal surface 111 than an end of the pair of second external electrodes 122, which is located closest to the first principal surface 111. As viewed from the laminating direction W, the distance T12 in the height direction T is about 3 μm or more, for example, between the end of the first external electrode 121, which is located closest to the first principal surface 111, and the end of the pair of second external electrodes 122, which is located closest to the first principal surface 111.

According to the present preferred embodiment, as shown in FIGS. 6 and 7, the maximum thickness T1 of the first external electrode 121 on the second principal surface 112 is larger than the maximum thickness T2 of the pair of second external electrodes 122 on the second principal surface 112. The maximum thickness T3 of the pair of insulating coating portions 130 on the second principal surface 112 is larger than the maximum thickness T1 of the first external electrode 121 on the second principal surface 112.

According to the present preferred embodiment, the pair of insulating coating portions 130 includes overlapping portions that overlap with respective portions of the first external electrode 121 and pair of second external electrodes 122 in the height direction T. The overlapping portions of the pair of insulating coating portions 130 cover the respective portions of the first external electrode 121 and pair of second external electrodes 122. More specifically, the laminated body 110 provided in advance with the first external electrode 121 and the pair of second external electrodes 122 is provided with the pair of insulating coating portions 130.

The pair of insulating coating portions 130 covers, at the second principal surface 112, a portion of the extended electrode portion of the first internal electrode layer 141, which is not covered with the first external electrode 121, and a portion of the extended electrode portion of the second internal electrode layer 142, which is not covered with the pair of second external electrodes 122.

The respective thicknesses of the dielectric layers 150 and internal electrode layers 140 included in the inner layer portion are measured as follows. First, the multilayer ceramic electronic component 100 is polished to expose a cross section perpendicular or substantially perpendicular to the length direction L. The exposed cross section is observed with a scanning electron microscope. Next, the respective thicknesses of the dielectric layers 150 and internal electrode layers 140 are measured on five lines in total: a center line along the laminating direction W, which passes through the center in the exposed cross section; and two lines drawn at regular intervals from the center line to each side. The average value for the five measurement values of the dielectric layers 150 is regarded as the thickness of the dielectric layer 150. The average value for the five measurement values of the internal electrode layers 140 is regarded as the thickness of the internal electrode layer 140.

It is to be noted that for each of a central portion and both ends of the exposed cross section in the laminating direction W, the respective thicknesses of the dielectric layers 150 and internal electrode layers 140 may be measured on the five lines mentioned above, and the average value for the measurement values of the dielectric layers 150 may be regarded as the thickness of the dielectric layer 150, whereas the average value for the measurement values of the internal electrode layers 140 may be regarded as the thickness of the internal electrode layer 140, for example.

The respective thicknesses of the first side margin, the second side margin, the first end margin, and the second end margin are measured as follows. First, the multilayer ceramic electronic component 100 is polished to expose a cross section perpendicular or substantially perpendicular to the laminating direction W. The exposed cross section is observed with a microscope for measurement. The measurement locations include a central portion in the length direction L for each of the first side margin and second side margin and a central portion in the height direction T for each of the first end margin and second end margin.

The maximum thickness T1 of the first external electrode 121, the maximum thickness T2 of the pair of second external electrodes 122, and the maximum thickness T3 of the pair of insulating coating portions 130 are each measured as follows. First, the multilayer ceramic electronic component 100 is polished to a central location in the laminating direction W, thus exposing a cross section perpendicular or substantially perpendicular to the laminating direction W. The exposed cross section is observed with a microscope for measurement.

The distance T12 and distance T13 mentioned above are each measured by observing a side surface of the multilayer ceramic electronic component 100 with a microscope.

Figure 8:
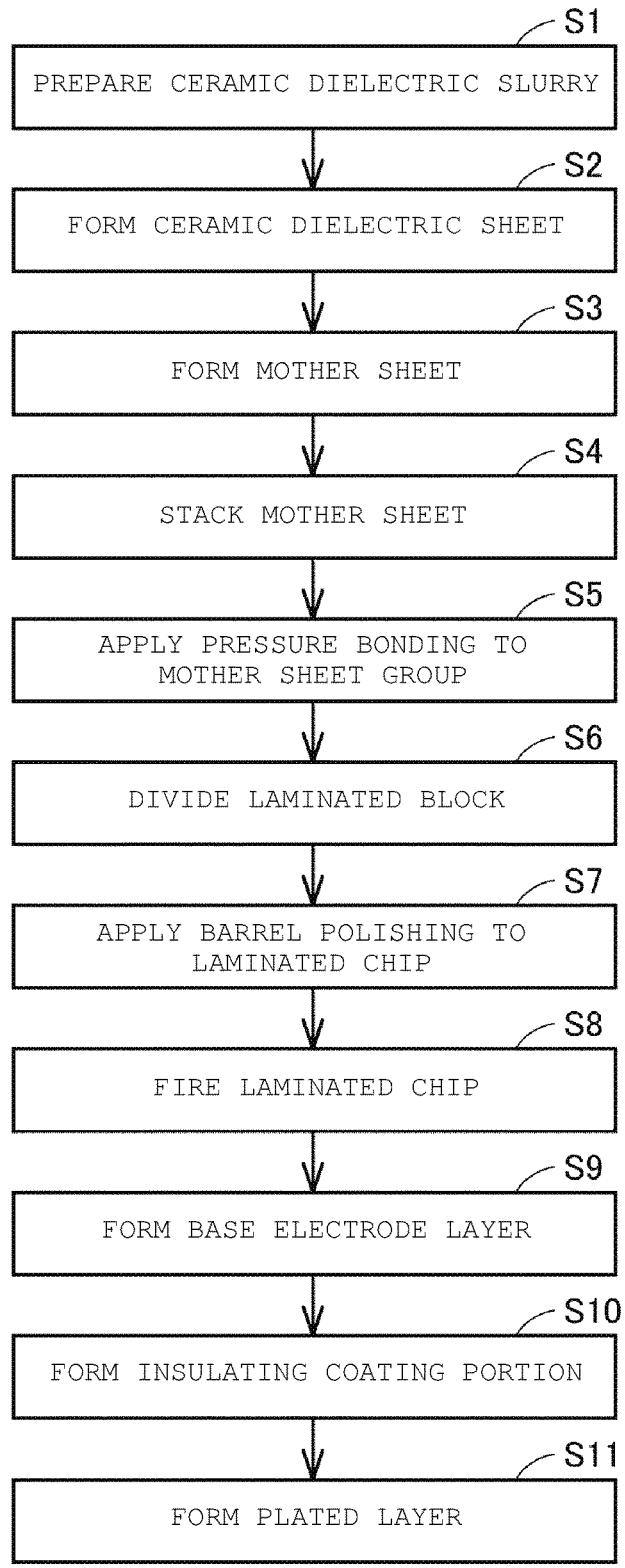
FIG. 8 is a flow diagram showing a method of manufacturing a multilayer ceramic electronic component according to the first preferred embodiment of the present invention.

A method of manufacturing the multilayer ceramic electronic component 100 according to the first preferred embodiment of the present invention is described below with reference to the drawings. FIG. 8 is a flow diagram showing a method of manufacturing the multilayer ceramic electronic component according to the first preferred embodiment of the present invention.

As shown in FIG. 8, to manufacture the multilayer ceramic electronic component 100 according to the first preferred embodiment of the present invention, first, ceramic dielectric slurry is prepared (step S1). Specifically, a ceramic dielectric powder, an additive powder, a binder resin, a dissolution liquid, and the like are dispersed and mixed, thus preparing ceramic dielectric slurry. The ceramic dielectric slurry may be solvent-based or water-based slurry, for example. When the ceramic dielectric slurry is a water-based coating, the ceramic dielectric slurry is prepared by mixing a water-soluble binder, a dispersant, and the like, and a dielectric raw material dissolved in water.

Next, ceramic dielectric sheets are formed (step S2). Specifically, the ceramic dielectric slurry is formed, on a carrier film, into a sheet by a die coater, a gravure coater, or the like, and dried, thus forming ceramic dielectric sheets. The ceramic dielectric sheet is preferably about 3 µm or less in thickness, for example, from the perspective of reducing the size of, and increasing the capacitance of the multilayer ceramic electronic component 100.

Next, mother sheets are formed (step S3). Specifically, a conductive paste is applied to the ceramic dielectric sheets so as to provide predetermined patterns, thus forming mother sheets with predetermined internal electrode patterns provided on the ceramic dielectric sheets. A screen printing method, an ink-jet method, a gravure printing method, or the like is able to be used as a method to apply the conductive paste. The internal electrode pattern is preferably about 1.5 µm or less in thickness, for example, from the perspective of reducing the size of, and increasing the capacitance of the multilayer ceramic electronic component 100. Further, as mother sheets, the ceramic dielectric sheets obtained without undergoing the step S3 mentioned above are also prepared in addition to the mother sheets with the internal electrode patterns.

Next, multiple mother sheets are stacked (step S4). Specifically, a predetermined number of mother sheets is stacked which each include only a ceramic dielectric sheet without any internal electrode pattern formed. A predetermined number of mother sheets provided with the internal electrode patterns is stacked thereon. Furthermore, a predetermined number of mother sheets is stacked thereon which each include only a ceramic dielectric sheet without any internal electrode pattern formed. Thus, a group of mother sheets is formed.

Next, the group of mother sheets is subjected to pressure bonding, thus forming a laminated block (step S5). Specifically, the group of mother sheets is subjected to pressure bonding by applying a pressure to the group in the stacking direction through isostatic press or rigid press, thus forming the laminated block.

Next, the laminated block is divided to form laminated chips (step S6). Specifically, the laminated block is divided into a matrix form by cutting by pushing, cutting with a dicing machine, or laser cutting, thus providing a plurality of individual laminated chips.

Next, the laminated chip is subjected to barrel polishing (step S7). Specifically, the laminated chips are encapsulated in a small box referred to as a barrel, along with media balls that are higher in hardness than the dielectric material, and the barrel is rotated, thus polishing the laminated chips. Thus, the laminated chips include corners and ridges that are rounded.

Next, the laminated chip is subjected to firing (step S8). Specifically, the laminated chip is heated, thus making the dielectric material and conductive material included in the laminated chip fired, and thus forming the laminated body 110. The firing temperature is set appropriately depending on the dielectric material and the conductive material, and preferably about 900° C. or higher and about 1300° C. or lower, for example.

Next, a conductive paste is applied to the surface of the laminated body 110. According to the present preferred embodiment, the conductive paste is applied to the surface of the laminated body 110 by a roller transfer method. However, the method to apply the conductive paste is not limited to the roller transfer method, but may be a spray coating method or a dip method, for example.

Figure 9:
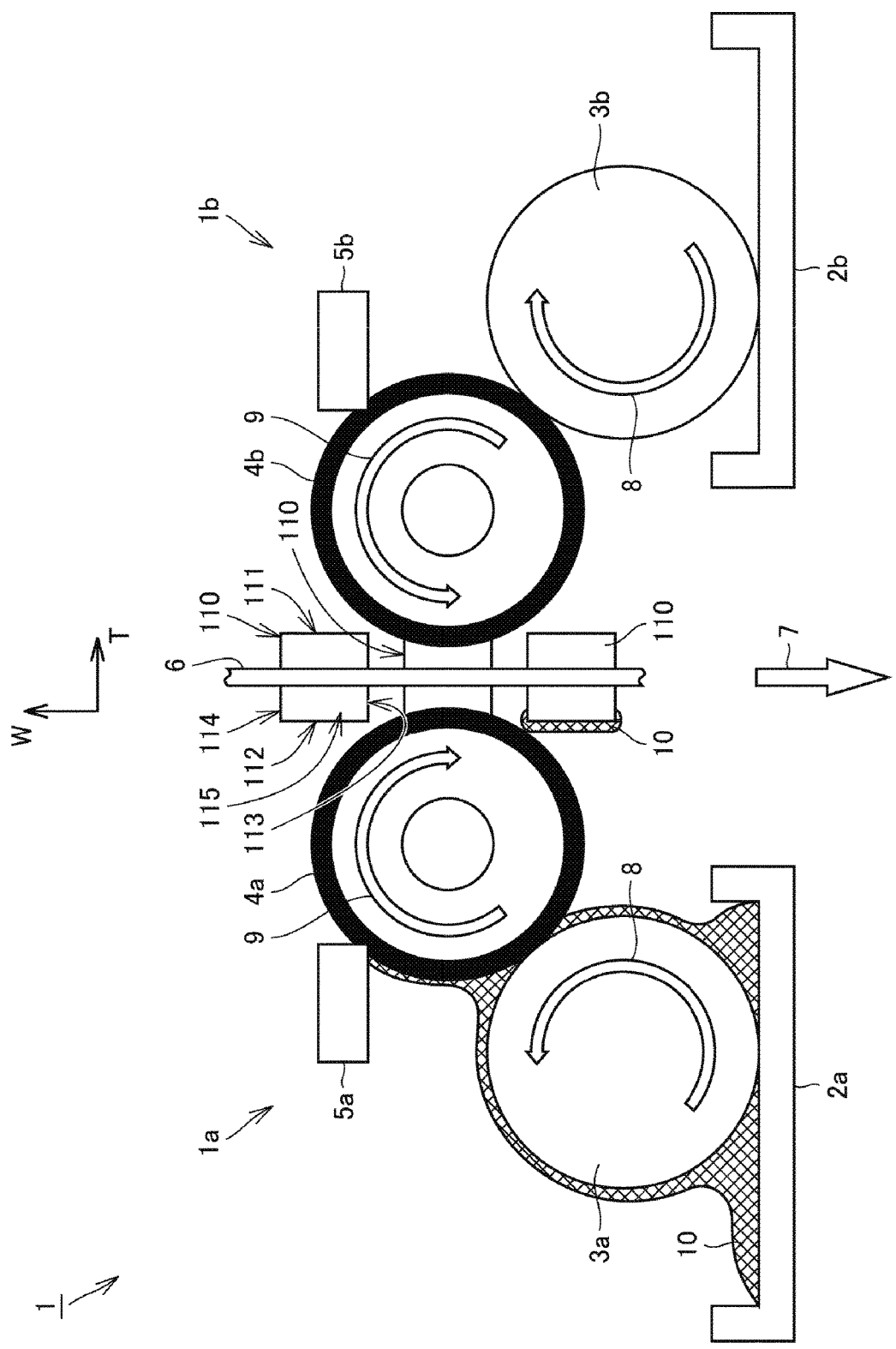
FIG. 9 is a cross-sectional view showing the configuration of an application system to apply a conductive paste to a laminated body of the multilayer ceramic electronic component according to the first preferred embodiment of the present invention.
Figure 10:
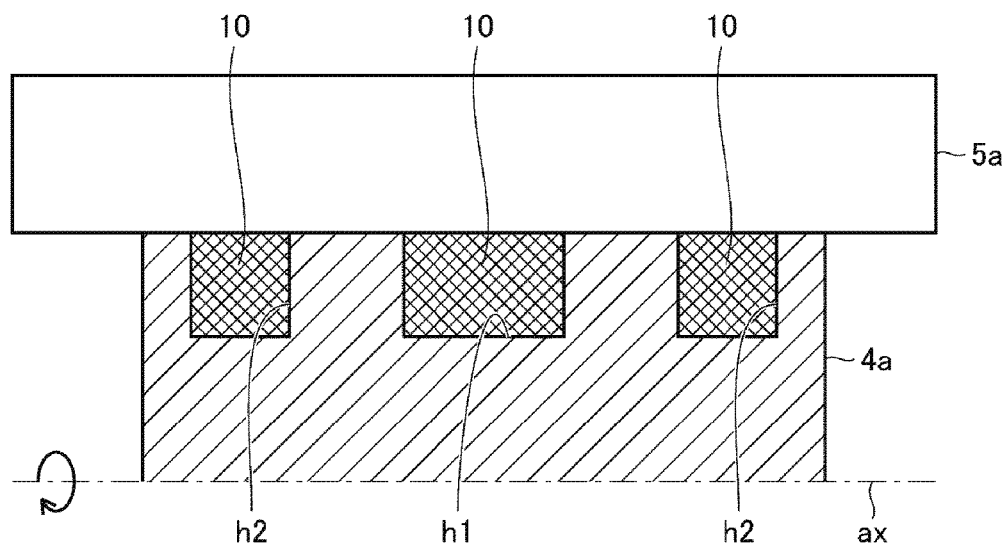
FIG. 10 is a cross-sectional view showing a first transfer roller and a first scraper in contact with each other in the application system to apply the conductive paste to the laminated body of the multilayer ceramic electronic component according to the first preferred embodiment of the present invention.

FIG. 9 is a cross-sectional view showing the configuration of an application system to apply the conductive paste to the laminated body of the multilayer ceramic electronic component according to the first preferred embodiment of the present invention. FIG. 10 is a cross-sectional view showing a first transfer roller and a first scraper in contact with each other in the application system to apply the conductive paste to the laminated body of the multilayer ceramic electronic component according to the first preferred embodiment of the present invention.

As shown in FIGS. 9 and 10, the application system 1 includes a first application mechanism 1a and a second application mechanism 1b spaced from each other. The first application mechanism 1a includes a first container 2a that stores a conductive paste 10, a first supply roller 3a partially located in the first container 2a, a first transfer roller 4a in rolling contact with an outer peripheral surface of the first supply roller 3a, and a first scraper 5a in slide contact with an outer peripheral surface of the first transfer roller 4a.

Likewise, the second application mechanism 1b includes a second container 2b, a second supply roller 3b partially located in the second container 2b, a second transfer roller 4b in rolling contact with an outer peripheral surface of the second supply roller 3b, and a second scraper 5b in slide contact with an outer peripheral surface of the second transfer roller 4b. The second container 2b is not filled with the conductive paste 10.

The first transfer roller 4a and the second transfer roller 4b each include a cylindrical body, and an elastic portion that covers the outer periphery of the body. While the body preferably includes iron, the material of the body is not limited to any iron, but may be other metals, or composite materials such as CFRP (Carbon Fiber Reinforced Plastics), for example. While the elastic portion preferably includes a silicone rubber, the material of the elastic portion is not limited to any silicone rubber, but may be other rubbers that have moderate deformation resistance, for example.

The first transfer roller 4a and the second transfer roller 4b each rotate around a rotation axis ax. For each of the first transfer roller 4a and the second transfer roller 4b, the outer peripheral surface is provided with a first groove h1 and a pair of second grooves h2 which are continuous annularly. The first groove h1 is provided in a central portion in the direction of the rotation axis ax at the outer peripheral surface for each of the first transfer roller 4a and the second transfer roller 4b. The pair of second grooves h2 is provided at both ends in the direction of the rotation axis ax at the outer peripheral surface for each of the first transfer roller 4a and the second transfer roller 4b.

According to the present preferred embodiment, the width of the first groove h1 is larger than the width for each of the pair of second grooves h2. According to the present preferred embodiment, the cross-sectional shape of the inside region for each of the first groove h1 and the pair of second grooves h2 is rectangular or substantially rectangular, but not limited to the rectangular or substantially rectangular shape, and may be semi-circular, semi-elliptical, or the like, for example.

The operation of the application system 1 to apply the conductive paste 10 to the laminated body 110 of the multilayer ceramic electronic component 100 will be described below. First, the first supply roller 3a and the second supply roller 3b are respectively rotated in directions opposite to each other as indicated by arrows 8. Thus, the conductive paste 10 in the first container 2a adheres to the outer peripheral surface of the first supply roller 3a.

In addition, the first transfer roller 4a and the second transfer roller 4b are respectively rotated in directions opposite to each other as indicated by arrows 9. The first transfer roller 4a comes into rolling contact with the first supply roller 3a. The second transfer roller 4b comes into rolling contact with the second supply roller 3b. Thus, the conductive paste 10 adhering to the outer peripheral surface of the first supply roller 3a is transferred to the outer peripheral surface of the first transfer roller 4a.

As shown in FIG. 10, the first scraper 5a in slide contact with the outer peripheral surface of the first transfer roller 4a fills the inside of the first groove h1 and the inside of the pair of second grooves h2 with the conductive paste 10 transferred to the outer peripheral surface of the first transfer roller 4a, and scrapes any excess of the paste.

Next, multiple laminated bodies 110 supported with a carrier tape 6 attached to each of first end surfaces 115 and second end surfaces 116 pass between the first transfer roller 4a and the second transfer roller 4b in the conveying direction indicated by an arrow 7, while being sequentially sandwiched between the first transfer roller 4a and the second transfer roller 4b. In this regard, the length direction L of the laminated body 110 and the direction of the rotation axis ax are parallel or substantially parallel, and the laminating direction W of the laminated body 110 and the conveying direction of the laminated body 110 are parallel or substantially parallel.

The conveying speed of the laminated body 110 is equal or substantially equal to the rotation speed of the outer periphery for each of the first transfer roller 4a and the second transfer roller 4b.

Figure 11:
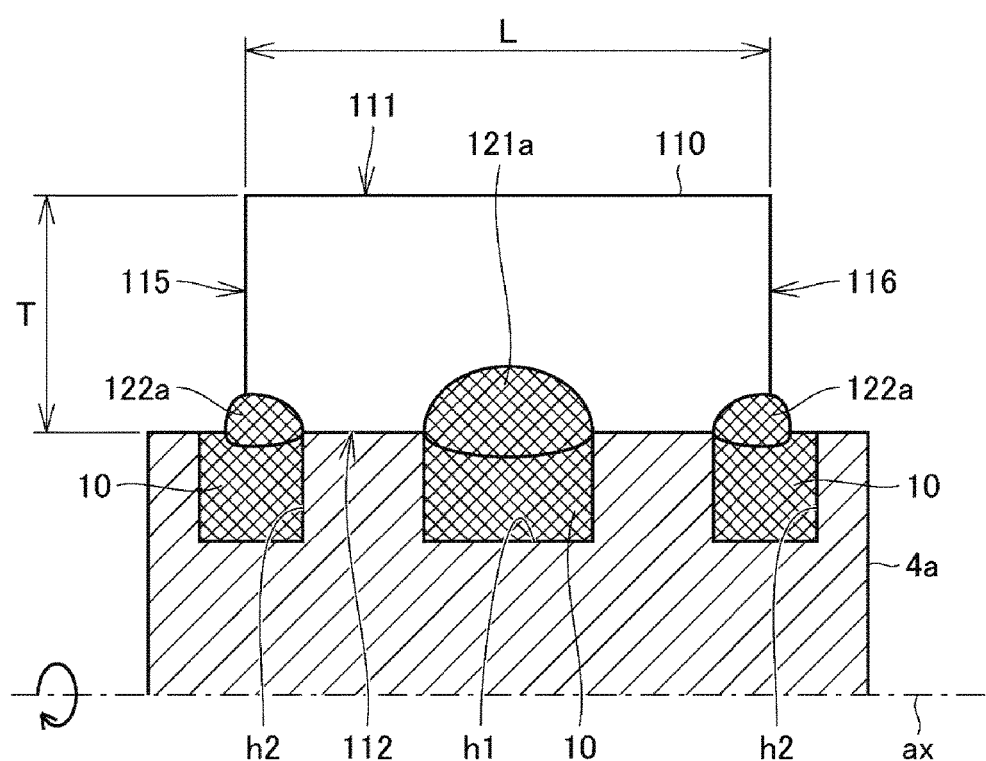
FIG. 11 is a cross-sectional view showing the first transfer roller and the laminated body in contact with each other in the application system to apply the conductive paste to the laminated body of the multilayer ceramic electronic component according to the first preferred embodiment of the present invention.

FIG. 11 is a cross-sectional view showing the first transfer roller and the laminated body in contact with each other in the application system to apply the conductive paste to the laminated body of the multilayer ceramic electronic component according to the first preferred embodiment of the present invention.

As shown in FIGS. 9 and 11, the conductive paste 10 filling the inside of the first groove h1 of the first transfer roller 4a is partially transferred from the second principal surface 112 of the laminated body 110 to respective portions of the first side surfaces 113 and second side surface 114, thus forming a first external electrode pattern 121a. The conductive paste 10 filling the inside of the pair of second grooves h2 of the first transfer roller 4a is partially transferred from the second principal surface 112 of the laminated body 110 to respective portions of the first side surfaces 113, second side surface 114, first end surface 115, and second end surface 116, thus forming a pair of second external electrode patterns 122a.

The width of the first groove h1 is larger than the width for each of the pair of second grooves h2, and the maximum thickness of the first external electrode pattern 121a on the second principal surface 112 is thus larger than the maximum thickness of the pair of second external electrode patterns 122a on the second principal surface 112.

In addition, a portion of the conductive paste 10 filling the inside of the pair of second grooves h2 also comes to the first end surface 115 and the second end surface 116 from the second principal surface 112, unlike a portion of the conductive paste 10 filling the inside of the first groove h1, and thus, as viewed from the laminating direction W, an end of the pair of second external electrode patterns 122a, which is located closest to the first principal surface 111, is located farther from the first principal surface 111 than an end of the first external electrode pattern 121a, which is located closest to the first principal surface 111.

Next, the first external electrode pattern 121a and the pair of second external electrode patterns 122a formed on the laminated body 110 are subjected to baking. Thus, baked layers that define and function as base electrode layers are formed (step S9). The baking temperature is, for example, about 840° C.

Next, ceramic dielectric slurry is applied to the surface of the laminated body 110. According to the present preferred embodiment, the ceramic dielectric slurry is applied to the surface of the laminated body 110 by a roller transfer method. However, the method used to apply the ceramic dielectric slurry is not limited to the roller transfer method, but may be a spray coating method or a dip method, for example.

Figure 12:
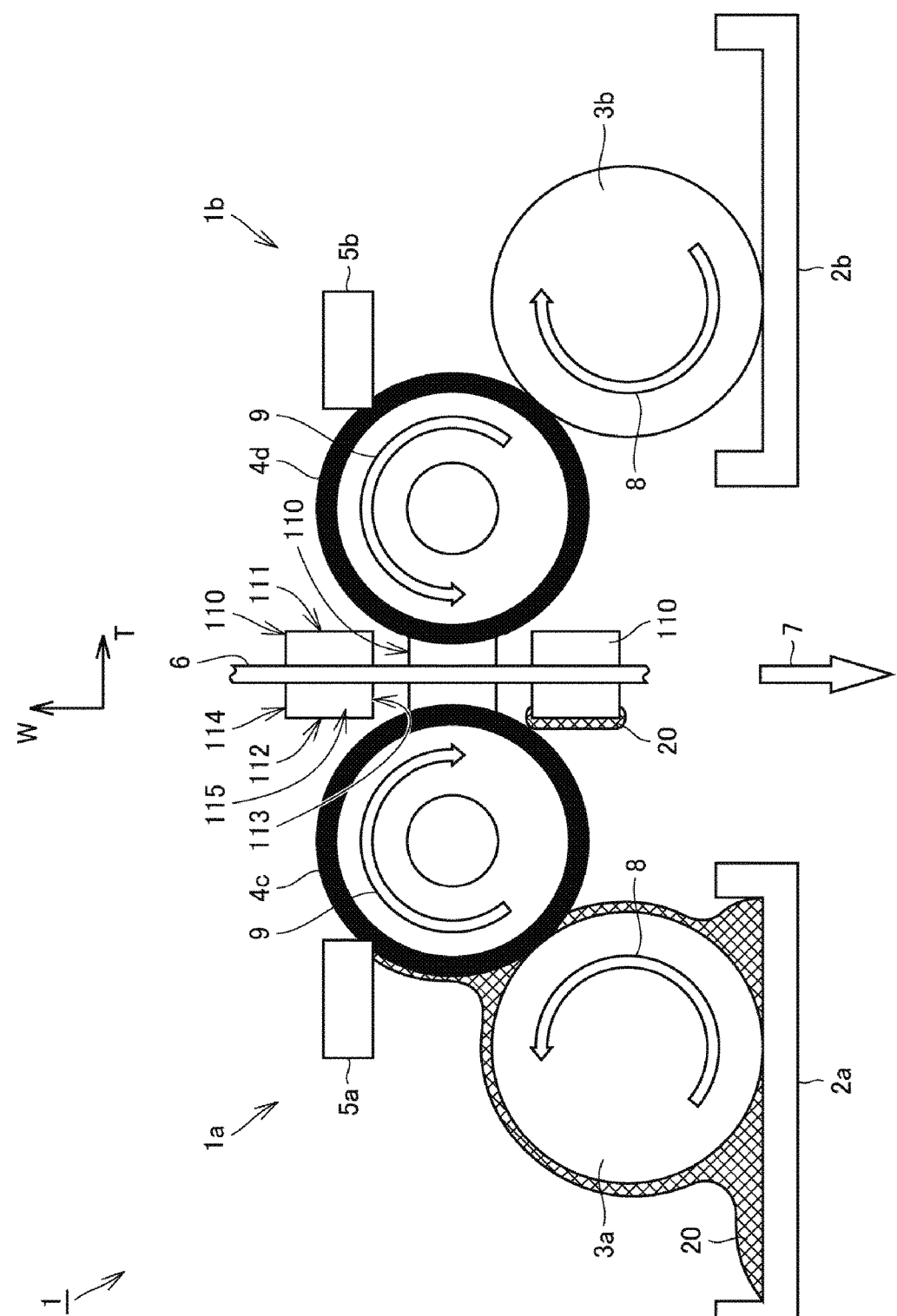
FIG. 12 is a cross-sectional view showing the configuration of an application system to apply ceramic dielectric slurry to the laminated body of the multilayer ceramic electronic component according to the first preferred embodiment of the present invention.
Figure 13:
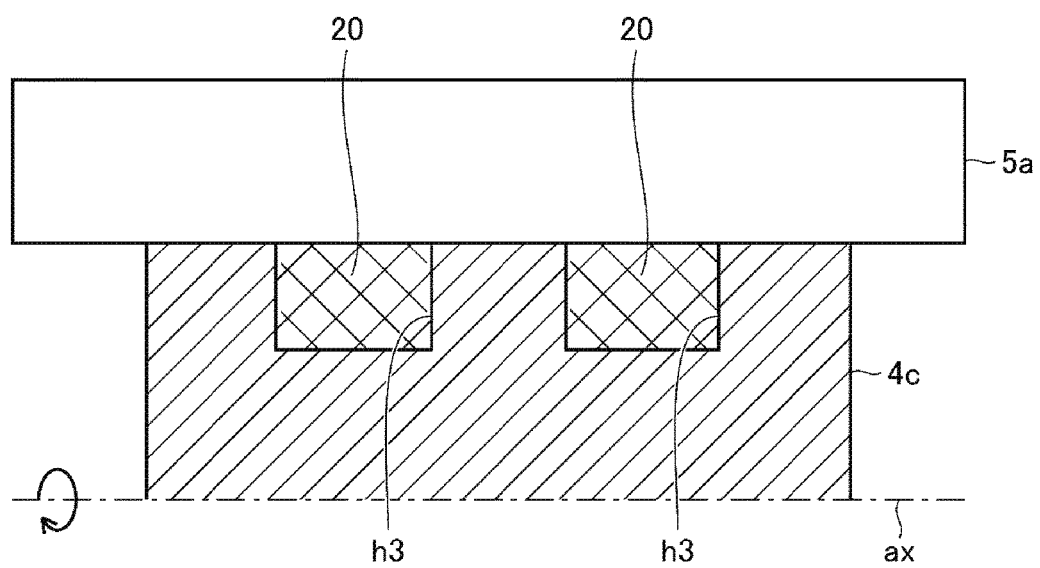
FIG. 13 is a cross-sectional view showing a first transfer roller and a first scraper in contact with each other in the application system to apply the ceramic dielectric slurry to the laminated body of the multilayer ceramic electronic component according to the first preferred embodiment of the present invention.

FIG. 12 is a cross-sectional view showing the configuration of an application system to apply the ceramic dielectric slurry to the laminated body of the multilayer ceramic electronic component according to the first preferred embodiment of the present invention. FIG. 13 is a cross-sectional view showing a first transfer roller and a first scraper in contact with each other in the application system to apply the ceramic dielectric slurry to the laminated body of the multilayer ceramic electronic component according to the first preferred embodiment of the present invention.

As shown in FIGS. 12 and 13, the application system 1 includes a first application mechanism 1a and a second application mechanism 1b spaced from each other. The first application mechanism 1a includes a first container 2a that stores ceramic dielectric slurry 20, a first supply roller 3a partially located in the first container 2a, a first transfer roller 4c in rolling contact with an outer peripheral surface of the first supply roller 3a, and a first scraper 5a in slide contact with an outer peripheral surface of the first transfer roller 4c.

The second application mechanism 1b includes a second container 2b, a second supply roller 3b partially located in the second container 2b, a second transfer roller 4d in rolling contact with an outer peripheral surface of the second supply roller 3b, and a second scraper 5b in slide contact with an outer peripheral surface of the second transfer roller 4d. The second container 2b is not filled with the ceramic dielectric slurry 20.

The first transfer roller 4c and the second transfer roller 4d each include a cylindrical body, and an elastic portion that covers the outer periphery of the body. While the body preferably includes iron, the material of the body is not limited to any iron, but may be other metals, or composite materials such as CFRP (Carbon Fiber Reinforced Plastics, for example. While the elastic portion preferably includes a silicone rubber, the material of the elastic portion is not limited to any silicone rubber, but may be other rubbers that have moderate deformation resistance, for example.

The first transfer roller 4c and the second transfer roller 4d each rotate around a rotation axis ax. For each of the first transfer roller 4c and the second transfer roller 4d, the outer peripheral surface is provided with a pair of third grooves h3 which are continuous annularly. The pair of third grooves h3 is spaced from each other in the direction of the rotation axis ax at the outer peripheral surface for each of the first transfer roller 4c and second transfer roller 4d. The pair of third grooves h3 for each of the first transfer roller 4c and second transfer roller 4d is provided in locations corresponding to the locations between each of the pair of second grooves h2 and the first groove h1 for each of the first transfer roller 4a and second transfer roller 4b.

According to the present preferred embodiment, the width for each of the pair of third grooves h3 is larger than the width of the first groove h1. According to the present preferred embodiment, the cross-sectional shape of the inside region for each of the pair of third grooves h3 is rectangular or substantially rectangular, but not limited to the rectangular or substantially rectangular shape, and may be semi-circular, semi-elliptical, or the like, for example.

The operation of the application system 1 to apply the ceramic dielectric slurry 20 to the laminated body 110 of the multilayer ceramic electronic component 100 will be described below. First, the first supply roller 3a and the second supply roller 3b are respectively rotated in directions opposite to each other as indicated by arrows 8. Thus, the ceramic dielectric slurry 20 in the first container 2a adheres to the outer peripheral surface of the first supply roller 3a.

In addition, the first transfer roller 4c and the second transfer roller 4d are respectively rotated in directions opposite to each other as indicated by arrows 9. The first transfer roller 4c comes into rolling contact with the first supply roller 3a. The second transfer roller 4d comes into rolling contact with the second supply roller 3b. Thus, the ceramic dielectric slurry 20 adhering to the outer peripheral surface of the first supply roller 3a is transferred to the outer peripheral surface of the first transfer roller 4c.

As shown in FIG. 13, the first scraper 5a in slide contact with the outer peripheral surface of the first transfer roller 4c fills the inside of the pair of third grooves h3 with the ceramic dielectric slurry 20 transferred to the outer peripheral surface of the first transfer roller 4c, and scrapes any excess paste.

Next, multiple laminated bodies 110 with first external electrodes 121 and pairs of second external electrodes 122, which are supported with a carrier tape 6 attached to each of first end surfaces 115 and second end surfaces 116 pass between the first transfer roller 4c and the second transfer roller 4d in the conveying direction indicated by an arrow 7, while being sequentially sandwiched between the first transfer roller 4c and the second transfer roller 4d. In this regard, the length direction L of the laminated body 110 and the direction of the rotation axis ax are parallel or substantially parallel, and the laminating direction W of the laminated body 110 and the conveying direction of the laminated body 110 are parallel or substantially parallel. The conveying speed of the laminated body 110 is equal or substantially equal to the rotation speed of the outer periphery for each of the first transfer roller 4c and the second transfer roller 4d.

According to the present preferred embodiment, the pressure of sandwiching the laminated body 110 between the first transfer roller 4c and the second transfer roller 4d is higher than the pressure of sandwiching the laminated body 110 between the first transfer roller 4a and the second transfer roller 4b.

Figure 14:
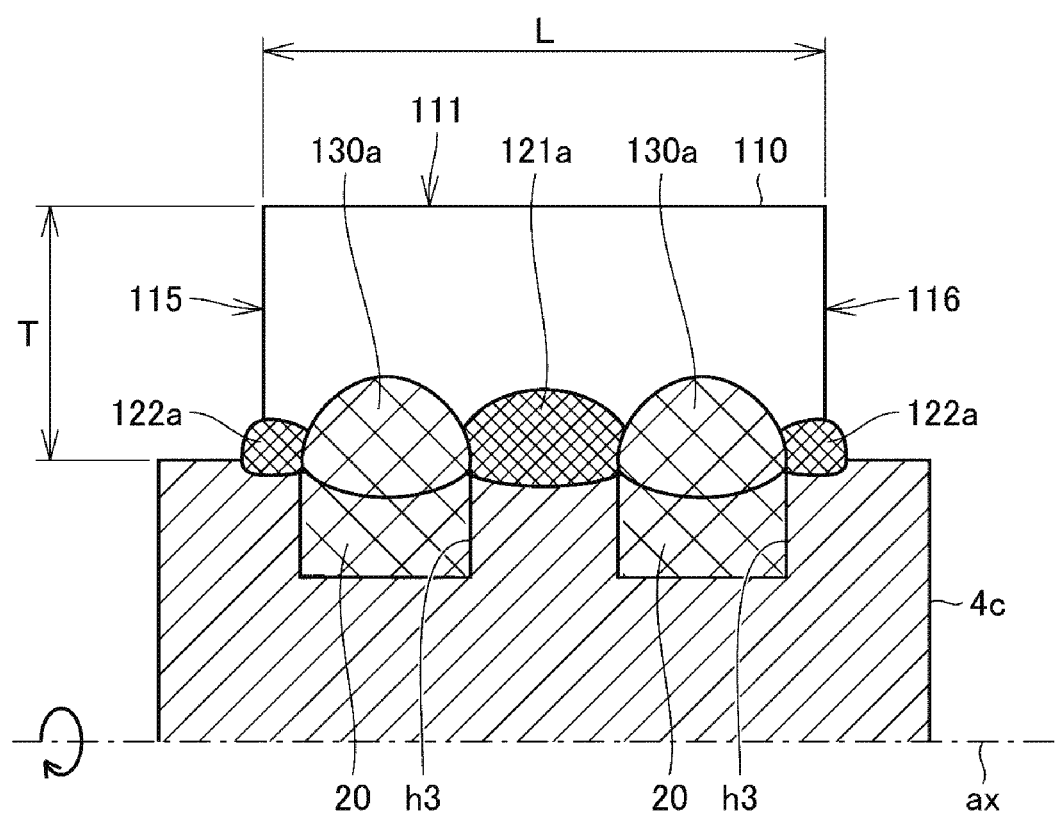
FIG. 14 is a cross-sectional view showing the first transfer roller and the laminated body in contact with each other in the application system to apply the ceramic dielectric slurry to the laminated body of the multilayer ceramic electronic component according to the first preferred embodiment of the present invention.

FIG. 14 is a cross-sectional view showing the first transfer roller and the laminated body in contact with each other in the application system to apply the ceramic dielectric slurry to the laminated body of the multilayer ceramic electronic component according to the first preferred embodiment of the present invention.

As shown in FIGS. 12 and 14, the ceramic dielectric slurry 20 filling the inside of the pair of third grooves h3 of the first transfer roller 4c is partially transferred from the second principal surface 112 of the laminated body 110 to respective portions of the first side surfaces 113 and second side surface 114, thus forming a pair of insulating coating patterns 130a.

The width for each of the pair of third grooves h3 is larger than the width of the first groove h1, and the maximum thickness of the pair of insulating coating patterns 130a on the second principal surface 112 is thus larger than the maximum thickness of the first external electrode pattern 121a on the second principal surface 112.

The pressure of sandwiching the laminated body 110 between the first transfer roller 4c and the second transfer roller 4d is higher than the pressure of sandwiching the laminated body 110 between the first transfer roller 4a and the second transfer roller 4b, and thus, as viewed from the laminating direction W, an end of the pair of insulating coating patterns 130a, which is located closest to the first principal surface 111, is located closer to the first principal surface 111 than an end of the first external electrode pattern 121a and pair of second external electrode patterns 122a, which is located closest to the first principal surface 111.

It is to be noted that the elastic portion for each of the first transfer roller 4c and second transfer roller 4d may include a softer material than the elastic portion for each of the first transfer roller 4a and the second transfer roller 4b, for example. In this case, even when the pressure of sandwiching the laminated body 110 between the first transfer roller 4c and the second transfer roller 4d is equal or substantially equal to the pressure of sandwiching the laminated body 110 between the first transfer roller 4a and the second transfer roller 4b, as viewed from the laminating direction W, an end of the pair of insulating coating patterns 130a, which is located closest to the first principal surface 111, is able to be located closer to the first principal surface 111 than an end of the first external electrode pattern 121a and pair of second external electrode patterns 122a, which is located closest to the first principal surface 111.

Next, the pair of insulating coating patterns 130a formed on the laminated body 110 is subjected to baking.

Thus, the pair of insulating coating portions 130 is formed on the outer surface of the laminated body 110 (step S10). The baking temperature is set to a lower temperature than the firing temperature for the laminated chip. When the material defining the insulating coating portions 130 is a dielectric ceramic, the baking temperature is, for example, about 900° C. When the material defining the insulating coating portions 130 is a resin, the baking temperature is, for example, about 300° C. When the material defining the insulating coating portions 130 is glass, the baking temperature is, for example, about 600° C. or higher and about 750° C. or lower.

Next, the laminated body 110 with the base electrode layers and insulating coating portions is subjected to plating treatment. The base electrode layers are subjected to Ni plating and Sn plating in this order to form Ni plated layers and Sn plated layers, thus forming the first external electrode 121 and the pair of second external electrodes 122 on the outer surface of the laminated body 110 (step S11).

The multilayer ceramic electronic component 100 is able to be manufactured through the series of steps described above.

In the multilayer ceramic electronic component 100 according to the present preferred embodiment, the maximum thickness T3 of the pair of insulating coating portions 130 on the second principal surface 112 is larger than the maximum thickness T1 of the first external electrode 121 on the second principal surface 112. Therefore, when the multilayer ceramic electronic component 100 is mounted on a substrate, the pair of insulating coating portions 130 is brought into contact with the substrate to form a gap between the substrate and the first external electrode 121. Solder used to mount the multilayer ceramic electronic component 100 on the substrate spreads out so as to fill the gap, and a solder layer of adequate thickness is able to be formed. As a result, the multilayer ceramic electronic component 100 is able to be mounted on the substrate with adequate fixing strength. In addition, when the multilayer ceramic electronic component 100 is sealed with a resin, and further subjected to reflow after mounting the multilayer ceramic electronic component 100 on the substrate, the phenomenon of blowing off the solder molten during the reflow due to expansion of voids, referred to as solder burst, is able to be significantly reduced or prevented, because the gap between the substrate and the first external electrode 121 is filled with the solder to cause no voids to remain.

Furthermore, the distances between each of the pair of second external electrodes 122 and the first external electrode 121 along the outer surfaces of the insulating coating portions 130 on the second principal surface 112 are extended by the insulating coating portions 130, thus significantly reducing or preventing the occurrence of short circuits due to migration along the outer surfaces of the insulating coating portions 130 on the second principal surface 112. From this perspective, the maximum thickness T3 of at least one of one insulating coating portion 130 and the other insulating coating portion 130 on the second principal surface 112 has only to be larger than the maximum thickness T1 of the first external electrode 121 on the second principal surface 112.

In the multilayer ceramic electronic component 100 according to the present preferred embodiment, the laminated body 110 provided in advance with the first external electrode 121 and the pair of second external electrodes 122 is provided with the pair of insulating coating portions 130, and the pair of insulating coating portions 130 covers respective portions of the first external electrode 121 and the pair of second external electrodes 122. As a result, the first external electrode 121 and the pair of second external electrodes 122 are able to be significantly reduced or prevented from peeling from the laminated body 110.

In this regard, an experimental example will be described which verified the relationship between the distance T13 mentioned above and the incidence of migration along the side surfaces of the laminated body 110. As an experimental condition, whether migration was caused along the side surfaces of the laminated body 110 or not was confirmed during a time period of about 1000 hours with a rated voltage applied to the multilayer ceramic electronic component under an environment at a temperature of about 125° C. and relative humidity of about 95%, after the multilayer ceramic electronic component placed on a substrate was subjected to general condensation.

In the present experimental example, twenty pieces were prepared for each of eight types of multilayer ceramic electronic components according to Examples 1 to 4 and Comparative Examples 1 to 4. The distance T13 was made to be about 20 μm for Example 1, about 80 μm for Example 2, about 140 μm for Example 3, about 200 μm for Example 4, about 0 μm for Comparative Example 1, about −20 μm for Comparative Example 2, about −40 μm for Comparative Example 3, and about −60 μm for Comparative Example 4.

It is to be noted that when the distance T13 has a negative value, as viewed from the laminating direction W, an end of the pair of insulating coating portions 130, which is located closest to the first principal surface 111, is located farther from the first principal surface 111 than an end of the first external electrode 121 and pair of second external electrodes 122, which is located closest to the first principal surface 111.

TABLE 1

| | Distance T13 (μm) | Incidence Rate of Migration |
|---|---|---|
| Example 1 | 20 | 2/20 |
| Example 2 | 80 | 1/20 |
| Example 3 | 140 | 0/20 |
| Example 4 | 200 | 0/20 |
| Comparative Example 1 | 0 | 4/20 |
| Comparative Example 2 | −20 | 4/20 |

TABLE 1-continued

|  | Distance T13 (μm) | Incidence Rate of Migration |
|---|---|---|
| Comparative Example 3 | −40 | 8/20 |
| Comparative Example 4 | −60 | 10/20 |

Table 1 summarizes experimental results according to the present experimental example. As shown in Table 1, the incidence rate of migration along the side surfaces of the laminated body 110 was about 10% or less in Examples 1 to 4 with the distance T13 of about 20 μm or more. On the other hand, the incidence rate of migration along the side surfaces of the laminated body 110 was about 20% or more in Comparative Examples 1 to 4 with the distance T13 of about 0 μm or less.

From the present experimental example, it has been successfully confirmed that the distances between each of the pair of second external electrodes 122 and the first external electrode 121 along the respective first side surface 113 and second side surface 114 of the laminated body 110 are extended by the insulating coating portions 130, thus significantly reducing or preventing the occurrence of short circuits due to migration. It has been successfully confirmed that, in particular, when the distance T13 is about 20 μm or more, for example, short circuits due to migration along the side surfaces of the laminated body 110 are able to be significantly reduced or prevented.

It is to be noted that when the distance T13 is larger than about 200 μm, for example, the surface areas of portions covered by the pair of insulating coating portions 130 are unfavorably increased in an excessive manner for each of the first external electrode 121 and the pair of second external electrodes 122, thus making it difficult to ensure the area of contact between each of the first external electrode 121 and pair of second external electrode 122 and a solder in the case of mounting the multilayer ceramic electronic component 100 on a substrate.

Second Preferred Embodiment

A multilayer ceramic electronic component according to a second preferred embodiment of the present invention will be described below. It is to be noted that the multilayer ceramic electronic component according to the second preferred embodiment of the present invention differs from the multilayer ceramic electronic component 100 according to the first preferred embodiment of the present invention, only in that the maximum thickness of the pair of second external electrodes on the second principal surface is larger than the maximum thickness of the pair of insulating coating portions on the second principal surface, and the description of the same or similar configuration as the multilayer ceramic electronic component 100 according to the first preferred embodiment of the present invention will not be repeated.

Figure 15:
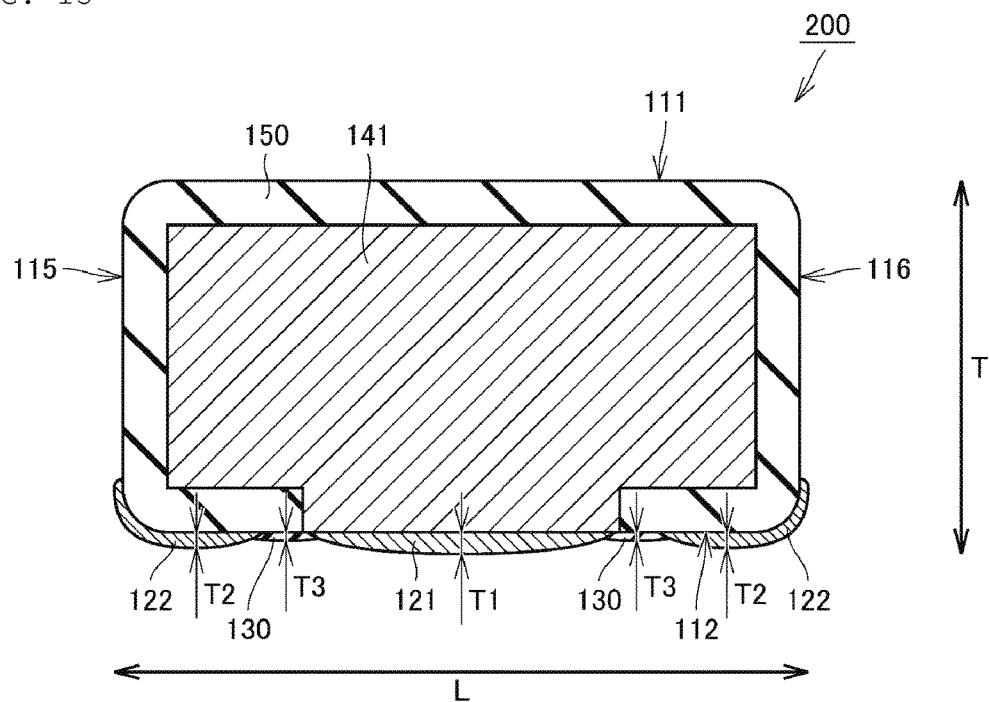
FIG. 15 is a cross-sectional view showing a multilayer ceramic electronic component according to a second preferred embodiment of the present invention, similar to the cross-sectional view shown in FIG. 6.
Figure 16:
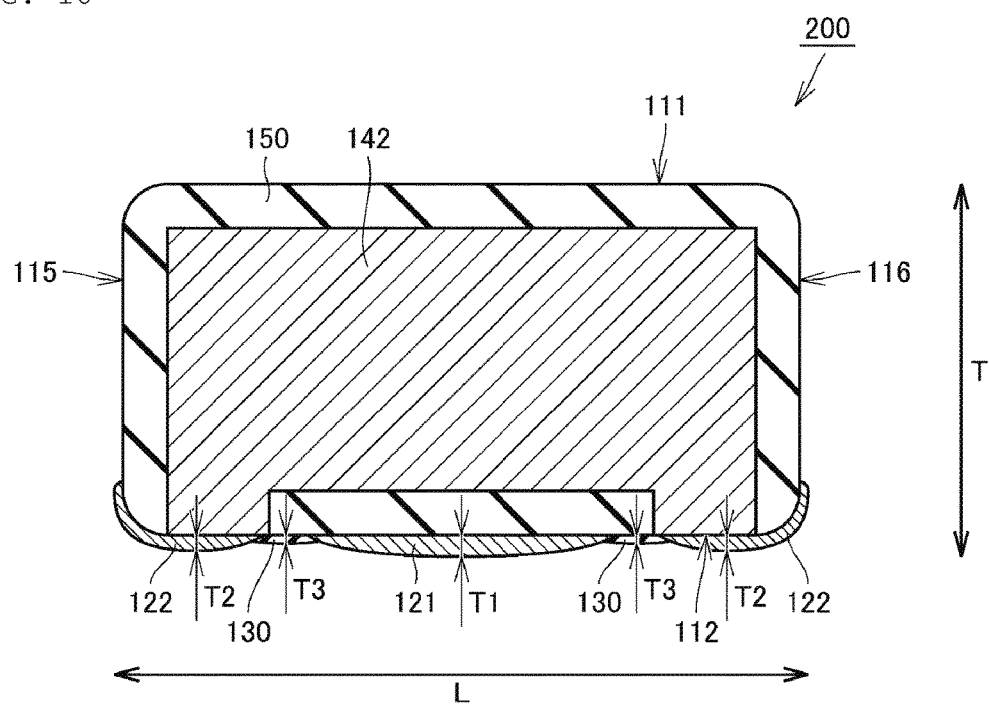
FIG. 16 is a cross-sectional view showing the multilayer ceramic electronic component according to the second preferred embodiment of the present invention, similar to the cross-sectional view shown FIG. 7.

FIG. 15 is a cross-sectional view showing the multilayer ceramic electronic component according to the second preferred embodiment of the present invention, similar to the cross-sectional view shown in FIG. 6. FIG. 16 is a cross-sectional view showing the multilayer ceramic electronic component according to the second preferred embodiment of the present invention, similar to the cross-sectional view shown in FIG. 7.

As shown in FIGS. 15 and 16, in a multilayer ceramic electronic component 200 according to the second preferred embodiment of the present invention, the maximum thickness T1 of a first external electrode 121 on a second principal surface 112 is larger than the maximum thickness T2 of a pair of second external electrodes 122 on the second principal surface 112. The maximum thickness T2 of the pair of second external electrodes 122 on the second principal surface 112 is larger than the maximum thickness T3 of a pair of insulating coating portions 130 on the second principal surface 112.

In an application system 1 to apply a conductive paste 10 to a laminated body 110 of the multilayer ceramic electronic component 200, the width of a first groove h1 is larger than the width for each of the pair of second grooves h2. The width of the first groove h1 is larger than the width for each of the pair of second grooves h2, and the maximum thickness of the first external electrode pattern 121a on the second principal surface 112 is thus larger than the maximum thickness of the pair of second external electrode patterns 122a on the second principal surface 112.

In an application system 1 to apply ceramic dielectric slurry 20 to the laminated body 110 of the multilayer ceramic electronic component 200, the width for each of a pair of third grooves h3 is smaller than the width for each of the pair of second grooves h2. The width for each of the pair of third grooves h3 is smaller than the width for each of the pair of second grooves h2, and the maximum thickness of a pair of insulating coating patterns 130a on the second principal surface 112 is thus smaller than the maximum thickness of the pair of second external electrode patterns 122a on the second principal surface 112.

In the multilayer ceramic electronic component 200 according to the present preferred embodiment, the maximum thickness T2 of the pair of second external electrodes 122 on the second principal surface 112 is larger than the maximum thickness T3 of the pair of insulating coating portions 130 on the second principal surface 112. Therefore, when the multilayer ceramic electronic component 200 is mounted on a substrate, the pair of insulating coating portions 130 is not brought into contact with the substrate. Therefore, the reduced maximum thickness T1 of the first external electrode 121 is able to reduce the mounting height of the multilayer ceramic electronic component 200 on the substrate. In addition, the reduced maximum thickness T1 of the first external electrode 121 is able to reduce the equivalent series inductance (ESL), because of the shortened current pathway connecting the circuit on the substrate and the multilayer ceramic electronic component 200.

Third Preferred Embodiment

A multilayer ceramic electronic component according to a third preferred embodiment of the present invention will be described below. It is to be noted that the multilayer ceramic electronic component according to the third preferred embodiment of the present invention differs from the multilayer ceramic electronic component 100 according to the first preferred embodiment of the present invention, mainly in that the overlapping portions of the pair of insulating coating portions are covered with respective portions of the first external electrode and pair of second external electrodes, and the description of the same or similar configuration as the multilayer ceramic electronic component 100 according to the first preferred embodiment of the present invention will not be repeated.

Figure 17:
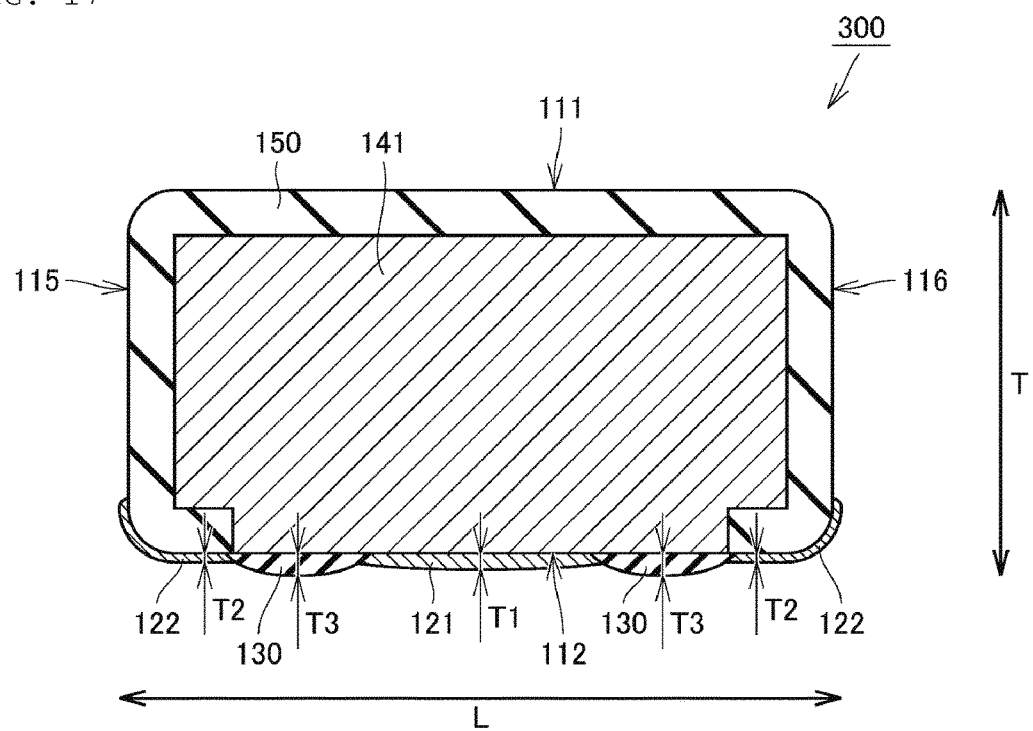
FIG. 17 is a cross-sectional view showing a multilayer ceramic electronic component according to a third preferred embodiment of the present invention, similar to the cross-sectional view shown in FIG. 6.
Figure 18:
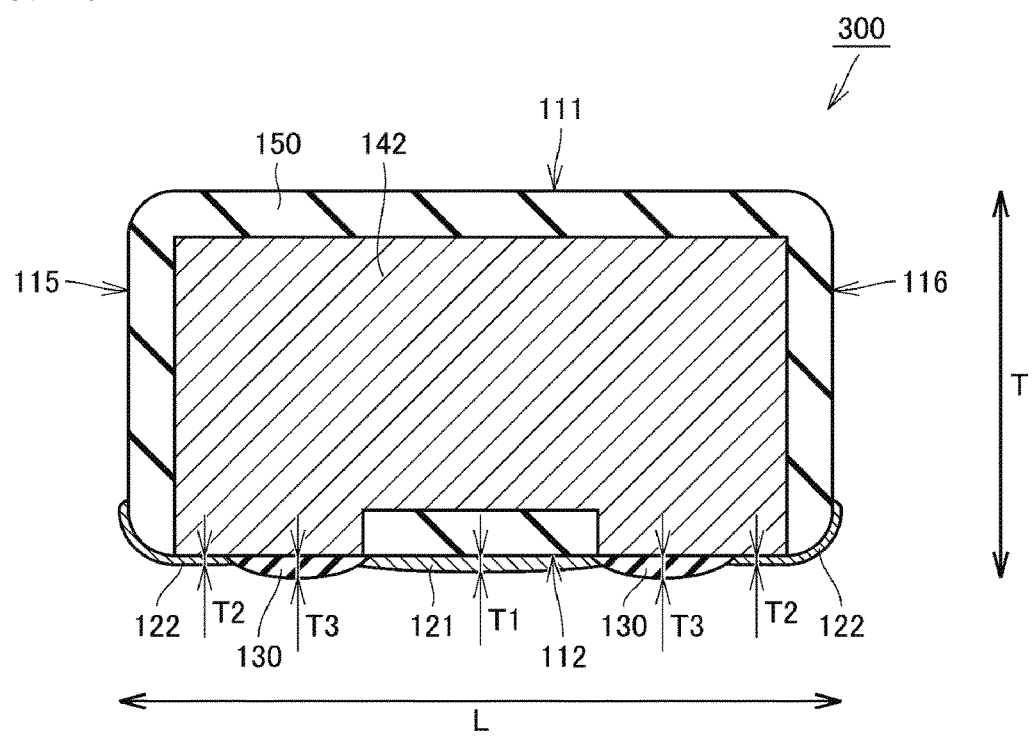
FIG. 18 is a cross-sectional view showing the multilayer ceramic electronic component according to the third preferred embodiment of the present invention, similar to the cross-sectional view shown in FIG. 7.
Figure 19:
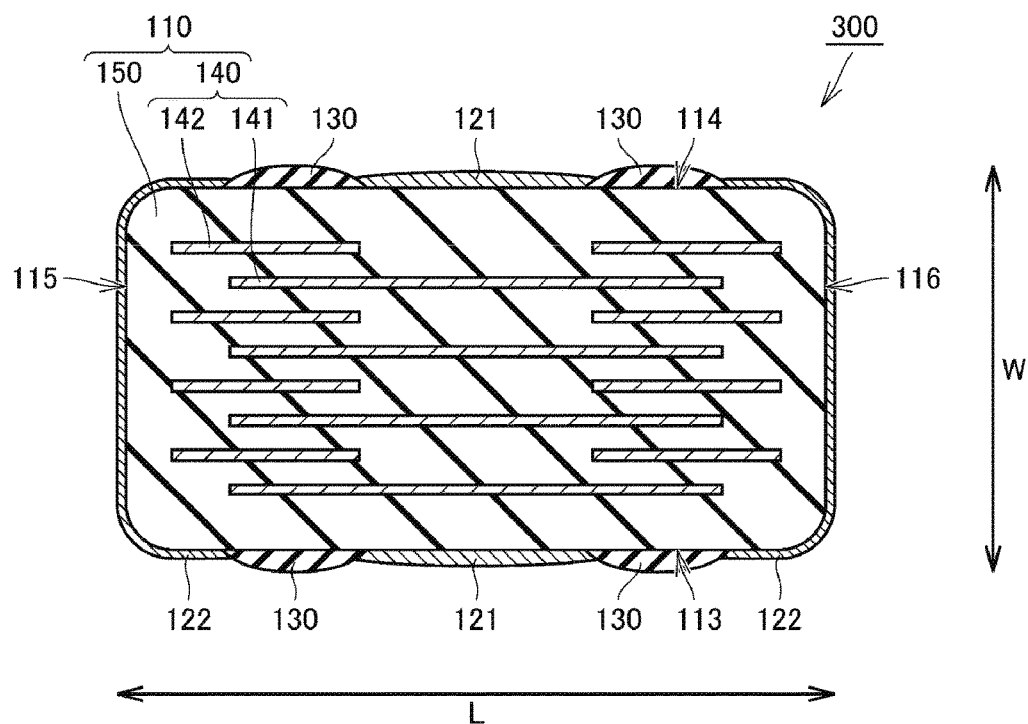
FIG. 19 is a cross-sectional view showing the multilayer ceramic electronic component according to the third preferred embodiment of the present invention, similar to in the cross-sectional view shown in FIG. 5.

FIG. 17 is a cross-sectional view showing the multilayer ceramic electronic component according to the third preferred embodiment of the present invention, similar to the cross-sectional view shown in FIG. 6. FIG. 18 is a cross-sectional view showing the multilayer ceramic electronic component according to the third preferred embodiment of the present invention, similar to the cross-sectional view shown in FIG. 7. FIG. 19 is a cross-sectional view showing the multilayer ceramic electronic component according to the third preferred embodiment of the present invention, similar to the cross-sectional view shown in FIG. 5.

As shown in FIGS. 17 and 18, the length in the length direction L of a laminated body 110 is longer for each of extended electrode portions of first internal electrode layers 141 and extended electrode portions of second internal electrode layers 142 in the multilayer ceramic electronic component 300 according to the third preferred embodiment of the present invention, as compared with the multilayer ceramic electronic component 100 according to the first preferred embodiment.

As a result, as shown in FIG. 19, the extended electrode portions of the first internal electrode layers 141 and the extended electrode portions of the second internal electrode layers 142 are partially opposite to each other with dielectric layers 150 interposed therebetween. Therefore, in the multilayer ceramic electronic component 300 according to the present preferred embodiment, the extended electrode portions of the first internal electrode layers 141 and the extended electrode portions of the second internal electrode layers 142 also generate electrostatic capacitance, thus resulting in increased capacitance.

According to the present preferred embodiment, the pair of insulating coating portions 130 includes overlapping portions that overlap with respective portions of the first external electrode 121 and pair of second external electrodes 122 in the height direction T. The overlapping portions of the pair of insulating coating portions 130 are covered with the respective portions of the first external electrode 121 and pair of second external electrodes 122. More specifically, the laminated body 110 provided in advance with pair of insulating coating portions 130 is provided with the first external electrode 121 and the pair of second external electrodes 122. Therefore, in manufacturing the multilayer ceramic electronic component 300 according to the present preferred embodiment, the step S10 mentioned above is carried out prior to the step S9 mentioned above.

The pair of insulating coating portions 130 covers, at the second principal surface 112, the portions where the first external electrode 121 and the pair of second external electrodes 122 are opposite to each other, and the first internal electrode layers 141 and the second internal electrode layers 142 are able to be significantly reduced or prevented from being short-circuited in the formation of the first external electrode 121 and the pair of second external electrodes 122.

Fourth Preferred Embodiment

A multilayer ceramic electronic component according to a fourth preferred embodiment of the present invention will be described below. It is to be noted that the multilayer ceramic electronic component according to the fourth preferred embodiment of the present invention differs from the multilayer ceramic electronic component 300 according to the third preferred embodiment of the present invention, only in that the maximum thickness of the pair of second external electrodes on the second principal surface is larger than the maximum thickness of the pair of insulating coating portions on the second principal surface, and the description of the same or similar configuration as the multilayer ceramic electronic component 300 according to the third preferred embodiment of the present invention will not be repeated.

Figure 20:
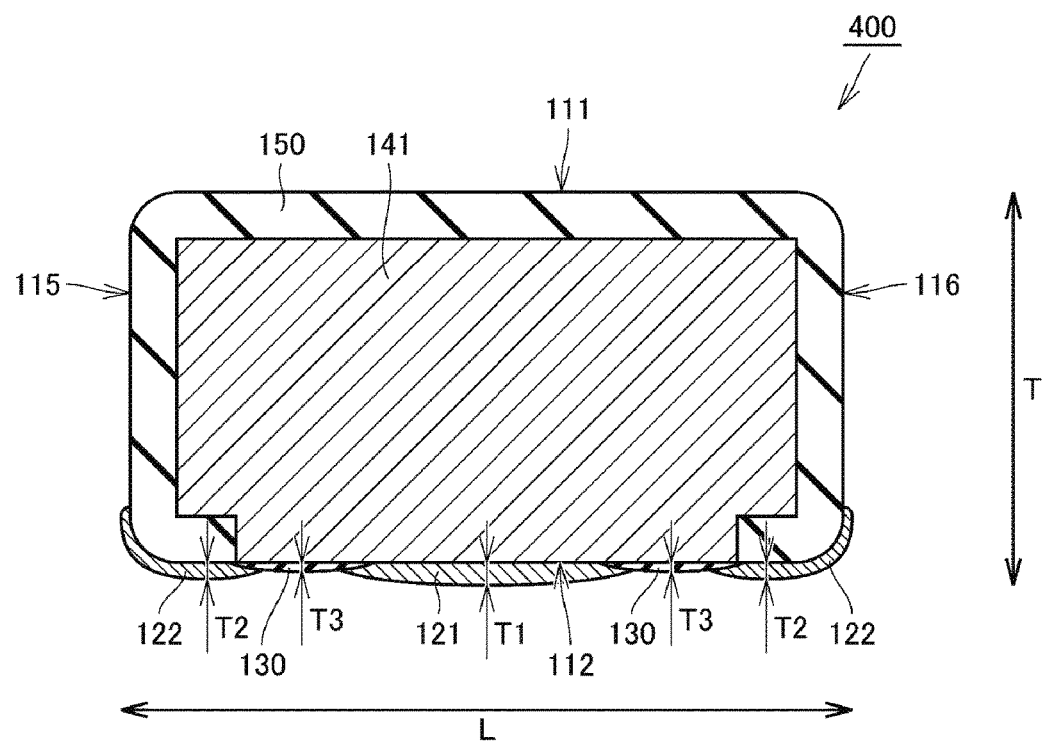
FIG. 20 is a cross-sectional view showing a multilayer ceramic electronic component according to a fourth preferred embodiment of the present invention, similar to the cross-sectional view shown in FIG. 6.
Figure 21:
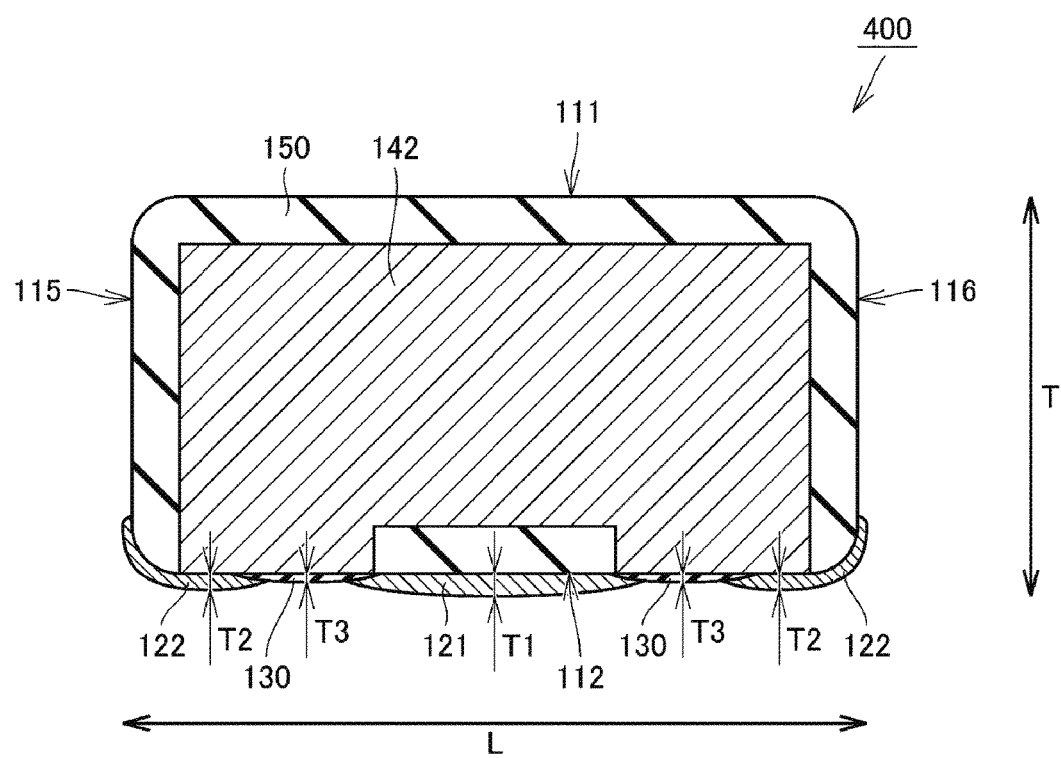
FIG. 21 is a cross-sectional view showing the multilayer ceramic electronic component according to the fourth preferred embodiment of the present invention, similar to the cross-sectional view shown in FIG. 7.

FIG. 20 is a cross-sectional view showing the multilayer ceramic electronic component according to the fourth preferred embodiment of the present invention, similar to the cross-sectional view shown in FIG. 6. FIG. 21 is a cross-sectional view showing the multilayer ceramic electronic component according to the fourth preferred embodiment of the present invention, similar to the cross-sectional view shown in FIG. 7.

As shown in FIGS. 20 and 21, in a multilayer ceramic electronic component 400 according to the fourth preferred embodiment of the present invention, the maximum thickness T1 of a first external electrode 121 on a second principal surface 112 is larger than the maximum thickness T2 of a pair of second external electrodes 122 on the second principal surface 112. The maximum thickness T2 of the pair of second external electrodes 122 on the second principal surface 112 is larger than the maximum thickness T3 of a pair of insulating coating portions 130 on the second principal surface 112.

Therefore, when the multilayer ceramic electronic component 400 is mounted on a substrate, the pair of insulating coating portions 130 is not brought into contact with the substrate. Therefore, the reduced maximum thickness T1 of the first external electrode 121 is able to reduce the mounting height of the multilayer ceramic electronic component 400 on the substrate. In addition, the reduced maximum thickness T1 of the first external electrode 121 is able to reduce the equivalent series inductance (ESL), because of the shortened current pathway connecting the circuit on the substrate and the multilayer ceramic electronic component 400.

In the preferred embodiments described above, the configurations which are able to be combined may be combined with each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic electronic component comprising:
a laminated body including:
a plurality of dielectric layers and a plurality of internal electrode layers laminated in a laminating direction; and
a first side surface and a second side surface opposite to each other in the laminating direction, a first principal surface and a second principal surface opposite to each other in a height direction perpendicular or substantially perpendicular to the laminating direction, and a first end surface and a second end surface opposite to each other in a length direction perpendicular or substantially perpendicular to the laminating direction and the height direction;
a first external electrode extending in the laminating direction on a central portion of the second principal surface in the length direction, over the second principal surface to respective portions of the first side surface and second side surfaces;
a pair of second external electrodes including:
one second external electrode extending in the laminating direction on one end of the second principal surface in the length direction; and another second external electrode extending in the laminating direction on the other end of the second principal surface in the length direction; and a pair of insulating coating portions including:
one insulating coating portion extending in the laminating direction between the one second external electrode and the first external electrode on the second principal surface; and
another insulating coating portion extending in the laminating direction between the another second external electrode and the first external electrode on the second principal surface; wherein the plurality of internal electrode layers include:
a plurality of first internal electrode layers connected to the first external electrode; and
a plurality of second internal electrode layers connected to each of the pair of second external electrodes;

the one second external electrode extends from the second principal surface to a portion of at least one of the first side surface and the second side surface, and to a portion of the first end surface;

the another second external electrode extends from the second principal surface to a portion of at least one of the first side surface and the second side surface, and to a portion of the second end surface;

the pair of insulating coating portions each extends from the second principal surface to a portion of the at least one of the first side surface and the second side surface;

as viewed from at least one direction in the laminating direction, an end of the pair of insulating coating portions, which is located closest to the first principal surface, is located closer to the first principal surface than an end of the first external electrode and pair of second external electrodes, which is located closest to the first principal surface; and as viewed from at least one direction in the laminating direction, a distance in the height direction is about 20 μm or more between an end of the pair of insulating coating portions, which is located closest to the first principal surface, and an end of the first external electrode and pair of second external electrodes, which is located closest to the first principal surface.

2. The multilayer ceramic electronic component according to claim 1, wherein
a maximum thickness of the first external electrode on the second principal surface is larger than a maximum thickness of the pair of second external electrodes on the second principal surface; and
a maximum thickness of the pair of insulating coating portions on the second principal surface is larger than the maximum thickness of the first external electrode on the second principal surface.

3. The multilayer ceramic electronic component according to claim 1, wherein
a maximum thickness of the first external electrode on the second principal surface is larger than a maximum thickness of the pair of second external electrodes on the second principal surface; and
the maximum thickness of the pair of second external electrodes on the second principal surface is larger than a maximum thickness of the pair of insulating coating portions on the second principal surface.

4. The multilayer ceramic electronic component according to claim 1, wherein
the pair of insulating coating portions includes overlapping portions that overlap with respective portions of the first external electrode and the pair of second external electrodes in the height direction; and
the overlapping portions of the pair of insulating coating portions cover the respective portions of the first external electrode and the pair of second external electrodes.

5. The multilayer ceramic electronic component according to claim 1, wherein
the pair of insulating coating portions includes overlapping portions that overlap with respective portions of the first external electrode and pair of second external electrodes in the height direction; and
the overlapping portions of the pair of insulating coating portions are covered with the respective portions of the first external electrode and pair of second external electrodes.

6. The multilayer ceramic electronic component according to claim 1, wherein the pair of insulating coating portions includes a material including a dielectric ceramic, a resin, or glass.

7. The multilayer ceramic electronic component according to claim 6, wherein
the pair of insulating coating portions includes a material including the dielectric ceramic; and
the dielectric ceramic includes $BaTiO_3$, $CaTiO_3$, $SrTiO_3$, or $CaZrO_3$.

8. The multilayer ceramic electronic component according to claim 6, wherein
the pair of insulating coating portions includes a material including the resin, and
the resin includes one of an epoxy-based resin and a polyimide-based resin.

9. The multilayer ceramic electronic component according to claim 6, wherein
the pair of insulating coating portions includes a material including the glass, and
the glass includes Ba or Sr.

10. The multilayer ceramic electronic component according to claim 1, wherein
the laminated body is segmented into a pair of outer layer portions and an inner layer portion in the laminating direction; and
each of the pair of outer layer portions includes one of the plurality dielectric layers and one of the plurality internal electrode layers.

11. The multilayer ceramic electronic component according to claim 1, wherein each of the plurality first internal electrode layers includes a first opposed electrode portion located opposite to a respective one of the plurality second internal electrode layers, and an extended electrode portion that extends from the opposed electrode portion to the second principal surface of the laminated body.

12. The multilayer ceramic electronic component according to claim 11, wherein each of the plurality second internal electrode layers includes a second opposed electrode portion located opposite to a respective one of the plurality first internal electrode layers, and an extended electrode portion that extends from the opposed electrode portion to the second principal surface of the laminated body.

13. The multilayer ceramic electronic component according to claim 12, wherein the first opposed electrode portion and the second opposed electrode portion define an electrostatic capacitor.

14. The multilayer ceramic electronic component according to claim 1, wherein the first external electrode and the pair of second external electrodes each include a base electrode layer and a plated layer on the base electrode layer.

15. The multilayer ceramic electronic component according to claim 14, wherein the base electrode layer includes at least one of a baked layer and a thin film layer.

16. The multilayer ceramic electronic component according to claim 14, wherein the plated layer includes a plurality of laminated layers.

17. The multilayer ceramic electronic component according to claim 3, wherein the multilayer ceramic electronic component is mounted on a substrate, the pair of insulating coating portions contacts with the substrate, and a gap is defined between the substrate and the first external electrode.

18. The multilayer ceramic electronic component according to claim 17, wherein the gap is filled with solder.

19. The multilayer ceramic electronic component according to claim 4, wherein the multilayer ceramic electronic component is mounted on a substrate and the pair of insulating coating portions do not contact with the substrate.

* * * * *